(12) United States Patent
Kikuchi et al.

(10) Patent No.: US 7,055,090 B2
(45) Date of Patent: May 30, 2006

(54) CODING APPARATUS, CODING METHOD, DECODING APPARATUS, AND DECODING METHOD

(75) Inventors: Atsushi Kikuchi, Kanagawa (JP); Masayuki Hattori, Kanagawa (JP)

(73) Assignee: Sony Corporation, Tokyo (JP)

( * ) Notice: Subject to any disclaimer, the term of this patent is extended or adjusted under 35 U.S.C. 154(b) by 437 days.

(21) Appl. No.: 10/648,093

(22) Filed: Aug. 26, 2003

(65) Prior Publication Data

US 2004/0123228 A1 Jun. 24, 2004

(30) Foreign Application Priority Data

Aug. 27, 2002 (JP) .............................. 2002-247318

(51) Int. Cl.
*G06F 11/00* (2006.01)

(52) U.S. Cl. ..................................................... 714/801
(58) Field of Classification Search ........ 714/799–801, 714/752, 786
See application file for complete search history.

(56) References Cited

U.S. PATENT DOCUMENTS 6,857,097 B1 * 2/2005 Yedidia et al. .............. 714/752

OTHER PUBLICATIONS

Vasic et al., irregular low density parity check codes: construction and performance on perpendicular magnetic recording channels, Sep. 2003, IEEE Trans. on Magnetics, vol. 39, No. 5, p. 2567-2569.*

Varnica et al., Optimized low density parity check codes for parital response channels, Apr. 2003, IEEE Comm. letters, vol. 7, No. 4, p. 168-170.*

Richardson et al., Design of capacity approaching Irregular low density parity check codes, Feb. 2001, IEEE Trans. on Info. Theory, vol. 47, No. 2, p. 619-637.*

Chung et al., Analysis of sum product decoding of low density parity check codes using a Gaussian approximation, Feb. 2001, IEEE Trans. on Info. Theory, vol. 47, No. 2, p. 657-670.*

R.G. Gallager, Low density parity check codes, 1963, M.I.T. Press, Cambridge, Massachusetts.*

(Continued)

*Primary Examiner*—Shelly Chase
(74) *Attorney, Agent, or Firm*—Finnegan, Henderson, Farabow, Garrett & Dunner, L.L.P.

(57) ABSTRACT

In a coding apparatus and a decoding apparatus, the performance of codes is improved by optimizing a degree sequence and a quantization step size. The coding apparatus includes a degree sequence calculator for calculating a degree sequence indicating the distribution of the number of 1s in the parity check matrix, a parity check matrix generator for producing a parity check matrix on the basis of the degree sequence calculated by the degree sequence calculator, and an encoder for coding the input data using the parity check matrix generated by the parity check matrix generator. The degree sequence calculator optimizes the degree sequence such that when, in the decoding apparatus for decoding coded data, a received value and a message are represented by a small number of bits, the error probability after decoding is minimized for a given variance of noise or the allowable variance of noise is maximized for a given error probability after decoding.

32 Claims, 17 Drawing Sheets

OTHER PUBLICATIONS

D.J.C. Mackay, Good error correcting codes based on very sparse matrices, 1999, IEEE Trans. on Info. THeory, IT-45, p. 399-431.*

M.G. Luby et al., Analysis of low density parity check codes and improved designs using irregular graphs, www.icsi.berkeley.edu/~luby/.*

* cited by examiner

FIG. 14

$$H = \begin{bmatrix} \cdots & \vdots & & & & & \\ \cdots 1 \cdots 1 & \cdot 1 \cdot 1 \cdot \cdot & \cdots 1 \cdots 1 \cdots 1 \\ & 1 & & & & & \\ & \vdots & & & & & \\ & 1 & & & & & \end{bmatrix}$$

CODING APPARATUS, CODING METHOD, DECODING APPARATUS, AND DECODING METHOD

BACKGROUND OF THE INVENTION

1. Field of the Invention

The present invention relates to a method and apparatus for coding input data using a low density parity check code, and also to a method and apparatus for decoding a code coded by the coding method or coding apparatus.

2. Description of the Related Art

In recent years, great advances have been achieved in communication technology such as mobile communication and deep space communication and also in broadcast technology such as surface-wave or satellite digital broadcast technology. With advances in those technologies, active research on the coding theory is being performed to achieve better error correction codes and higher decoding efficiency.

The code performance has a theoretical limit known as Shannon limit proposed by C. E. Shannon.

An object of the research of the coding theory is to achieve codes having high performance close to the Shannon limit. In recent years, coding algorithms called turbo coding such as parallel concatenated convolutional coding (PCCC) or serially concatenated convolutional coding (SCCC), which exhibit high performance close to the Shannon limit, have been developed.

While such turbo coding has been developed, low density parity check (LDPC) coding, which has been known for a long time, is now receiving much attention.

The LDPC coding was first proposed by R. G. Gallager in "Low-Density Parity-Check Codes" (M. I. T. Press, Cambridge, Mass., 1963), and rediscovered by researchers such as D. J. C. Mackay in "Good error correcting codes based on very sparse matrices" (submitted to IEEE Trans. Inf. Theory, IT-45, pp.399–431, 1999) and M. G. Luby, M. Mitzenmacher, M. A. Shokrollahi, and D. A. Spielman in "Analysis of low density codes and improved designs using irregular graphs" (available at http://www.icsi.berkeley.edu/luby/).

Recent researches have revealed that the LDPC coding can provide high performance close to the Shannon limit, like the turbo coding, if the code length is long enough. In LDPC codes, the minimum distance is proportional to the word length, and thus low block error rates can be achieved. Another advantage of LDPC coding is that, unlike the turbo coding, substantially no error floor occurs in decoding.

The LDPC coding is described in further detail below. In the following discussion, the LDPC codes are assumed to be binary linear codes, although the LDPC codes are not necessarily needed to be binary linear codes.

The most significant feature of LDPC codes is that a parity check matrix, which defines a LDPC code, is sparse. Herein, a "sparse matrix" refers to a matrix in which a very small number of elements of the total number of elements have a value of 1. Hereinafter, a sparse parity check matrix is denoted by H. FIG. 14 shows an example of a sparse parity check matrix H, in which the Hamming weight of each column is 3 and the Hamming weight of each row is 6.

LDPC codes, defined by such a parity check matrix H in which all rows are equal in Hamming weight and all columns are equal in Hamming weight, are called regular LDPC codes. In contrast, LDPC codes defined by a parity check matrix H in which Hamming weights are not equal for all rows and not equal for all columns are called irregular LDPC codes.

Coding using LDPC codes is performed as follows. First, a generator matrix G is generated on the basis of a parity check matrix H. A codeword is then generated by multiplying a binary information message by the generator matrix G. More specifically, coding is performed by a coding apparatus designed for coding using LDPC codes, as follows. The coding apparatus first calculates a generator matrix G that satisfies $GH^T=0$ wherein $H^T$ is the transpose matrix of the parity check matrix H. If the generator matrix G is a k×n matrix, the coding apparatus generates an n-bit codeword by multiplying a k-bit information message by the generator matrix G. The codeword generated by the coding apparatus is transmitted after the codeword is mapped such that bits of "0" are converted to "+1" and bits of "1" are converted to "−1". The transmitted codeword is received by a decoding apparatus via a particular communication channel.

LDPC codes can be decoded using probabilistic decoding which is a decoding algorithm proposed by Gallager. In the probabilistic decoding algorithm, decoding is performed via belief propagation on a Tanner graph including variable nodes (also called message nodes) and check nodes according to a message passing algorithm. However, in the probabilistic decoding, because messages which are passed among nodes take real numbers, it is required to deal with real-valued probability distributions associated with messages, and thus very difficult analytical operation is required.

To avoid the above problem, Gallager has proposed algorithm A and algorithm B as algorithms of decoding LDPC codes.

In general, decoding of LDPC codes is performed according to a procedure shown in FIG. 15, in which a received value is denoted by $U_o(u_{oi})$, a message output from a check node is denoted by $u_j$, a message output from a variable node is denoted by $v_i$, wherein messages refers to real numbers indicating, in log likelihood ratio, likelihood that values are equal to 0.

In decoding of a LDPC code, as shown in FIG. 15, if a received value $U_o(u_{oi})$ is acquired, in step S11, a message $u_j$ is set to be 0 and an integer k is set to be 0, wherein the integer k is a counter value indicating the number of times the process is iterated.

In the next step S12 in the decoding of the LDPC code, a message $v_i$ is determined from the received value $U_o(u_{oi})$ by calculating equation (4) described below.

$$v_i = u_{0i} + \sum_{j=1}^{dv-1} u_j \quad (4)$$

A message $u_j$ is then determined from the message $v_i$ by calculating equation (5) described below.

$$\tanh\left(\frac{u_j}{2}\right) = \prod_{i=1}^{dc-1} \tanh\left(\frac{v_i}{2}\right) \quad (5)$$

Furthermore, in step S12 in the LDPC decoding process, the integer k is incremented by 1.

In equation (4), dv is a parameter which can be arbitrarily set to indicate the number of 1s in the vertical direction (in columns of the parity check matrix H, and dc in equation (5) is a parameter which can be arbitrarily set to indicate the number of 1s in the horizontal direction (in rows). For example, in the case of a (3, 6) code, dv=3 and dc=6. In the calculations of equations (4) and (5), a message input from an edge to which an output is to be passed is not used as a parameter in the product or the sum, and thus the product and the sum are calculated in ranges whose upper limits are given by dv−1 and dc−1, respectively. In practice, the calculation of equation (5) is performed by producing a table of a function R which defines one output for given two inputs $v_1$ and $v_2$ according to equation (6), and by iteratively applying the function R as shown in equation (7).

$$x = 2 \tan h^{-1} \{\tan h(v_1/2) \tan h(v_2/2)\} = R(v_1, v_2) \quad (6)$$

$$u_j = R(v_1, R(v_2, R(v_3, \ldots R(v_{dc-2}, v_{dc-1})))) \quad (7)$$

In the next step S13 in the decoding of the LDPC code, it is determined whether the integer k is greater than N.

If it is determined that the integer k is not greater than N, the process returns to step S12. However, if it is determined that the integer k is greater than N, the process proceeds to step S14.

In step S14 in the LDPC decoding process, a message $v_i$, which is to be output as a final decoding result, is determined by calculating equation (8) described below, and the LDPC decoding process is completed.

$$v_i = u_{0i} + \sum_{j=1}^{dv} u_j \quad (8)$$

In equation (8), unlike equation (4), the summation is performed for all messages input from connected edges.

For example, in the case of a (3, 6) code, messages are passed among nodes during the LDPC decoding process as shown in FIG. 16. In FIG. 16, at those nodes marked "=", a calculation is performed in accordance with equation (4), while a calculation is performed in accordance with equation (5) at those nodes marked "+". In the algorithm A described above, messages are binarized and exclusive-OR operation is performed on dc−1 input messages at nodes marked "+". At nodes marked "=", if dv−1 input messages are all different in bit value for a given received value R, the sign is inverted in the output.

If irregular LDPC codes are used, the performance of LDPC codes can be improved.

In irregular LDPC codes, a parity check matrix is defined by a degree sequence. The degree sequence indicates the distribution of number of 1s included in the parity check matrix.

However, in LDPC codes, dependence of the performance on the degree sequence has not been investigated, and there are no guidelines for optimization of the degree sequence. In other words, there is a possibility that the performance of LDPC codes can be improved by optimizing the degree sequence.

In decoding of LDPC codes, a received value is first quantized. In the quantization of the received value, or in quantization of messages passed among nodes, the performance varies depending on the quantization step size, in particular, when quantization is performed using a small number of bits.

When quantization is performed using a small number of bits, decoding of LDPC codes is generally performed according to a procedure shown in FIG. 17.

That is, as shown in FIG. 17, in the first step S21 in the LDPC decoding process, a received value $U_o(u_{oi})$ is quantized using a small number of bits, and a message $v_i$ is set to be $u_{oi}$. Furthermore, an integer k, which is a counter value indicating the number of times the process is iterated, is set to 0, For example, in decoding of LDPC codes, when messages are represented by 2 bits, a received value $U_o(u_{oi})$ is quantized into a value expressed in 3 bits. In the LDPC decoding process, the received value $U_o(u_{oi})$ quantized into the 3-bit value is quantized into a 2-bit value and used in calculation of the message $v_i$.

In the next step S22 in the decoding of the LDPC code, a message $u_j$ is determined from the message $v_i$, and furthermore, by calculating equation (4), the message $v_i$ is determined from the received value $U_o(u_{oi})$ and the calculated message $u_j$. Furthermore, in step S22 in the LDPC decoding process, the integer k is incremented by 1.

In practice, in decoding of the LDPC code, the message $u_j$ represented by the small number of bits is determined by preparing a table of a function R which defines one output represented by the small number of bits for given two inputs $v_1$ and $v_2$, and by iteratively applying the function R, as described earlier. When the message $v_i$ is determined according to equation (4), the number of bits increases. The message $v_i$ with the increased number of bits is quantized into 2 bits.

In the next step S23 in the decoding of the LDPC code, it is determined whether the integer k is greater than N.

If it is determined that the integer k is not greater than N, the process returns to step S22. However, if it is determined that the integer k is greater than N, the process proceeds to step S24.

In step S24 in the LDPC decoding process, a message $v_i$, which is to be output as a final decoding result, is determined and output. Thus, the LDPC decoding process is completed.

In decoding of LDPC codes, the performance varies depending on the quantization step size used in quantization of a received value and messages passed among nodes. Furthermore, in decoding of LDPC codes, the performance also depends on the quantization step size used to determine messages $v_i$ according to equation (4).

However, the dependence of the quantization step size on the performance in decoding of LDPC codes has not been investigated, and there are no guidelines for optimization of the quantization step size. In other words, there is a possibility that the performance of LDPC decoding can be improved by optimizing the quantization step size.

SUMMARY OF THE INVENTION

In view of the above, an object of the present invention is to provide a method and apparatus for coding data into a LDPC code, capable of achieving high code performance by optimizing a degree sequence which defines a parity check matrix used in coding. Another object of the present invention is to provide a method and apparatus for decoding a LDPC code, capable of obtaining high-accuracy decoded data by optimizing a quantization step size.

To achieve the first object described above, the present invention provides a coding apparatus for coding input data using a low density parity check code, comprising degree sequence calculation means for calculating a degree sequence indicating the distribution of the number of 1s in the parity check matrix, parity check matrix generation means for generating a parity check matrix on the basis of the degree sequence calculated by the degree sequence calculation means, and coding means for coding the input data using the parity check matrix generated by the parity check matrix generation means, wherein the degree sequence calculation means optimizes the degree sequence such that when, in a decoding apparatus for decoding coded data, a received value and a message are represented by a small number of bits, the error probability after decoding is minimized for a given variance of noise or the allowable variance of noise is maximized for a given error probability after decoding.

In this coding apparatus according to the present invention, the degree sequence calculation means optimizes the degree sequence such that the error probability after decoding is minimized for a given variance of noise or the allowable variance of noise is maximized for a given error probability after decoding.

To achieve the first object, the present invention also provides a coding method for coding input data using a low density parity check code, comprising the steps of calculating a degree sequence indicating the distribution of the number of 1s in the parity check matrix, generating a parity check matrix on the basis of the degree sequence calculated in the degree sequence calculation step, and coding the input data using the parity check matrix generated in the parity check matrix generation step, wherein in the degree sequence calculation step, the degree sequence is optimized such that when, in a decoding process of decoding coded data, a received value and a message are represented by a small number of bits, the error probability after decoding is minimized for a given variance of noise or the allowable variance of noise is maximized for a given error probability after decoding.

In this coding method according to the present invention, the degree sequence is optimized such that the error probability after decoding is minimized for a given variance of noise or the allowable variance of noise is maximized for a given error probability after decoding.

To achieve the second object described above, the present invention provides a decoding apparatus for decoding a code coded by a coding apparatus using a low density parity check code, the coding apparatus comprising degree sequence calculation means for calculating a degree sequence indicating the distribution of the number of 1s in the parity check matrix, parity check matrix generation means for generating a parity check matrix on the basis of the degree sequence calculated by the degree sequence calculation means, and coding means for coding the input data using the parity check matrix generated by the parity check matrix generation means, wherein the degree sequence calculation means optimizes the degree sequence such that the error probability after decoding is minimized for a given variance of noise or the allowable variance of noise is maximized for a given error probability after decoding, the decoding apparatus comprising receiving means for receiving data transmitted from the coding apparatus thereby acquiring a received value, quantization means for quantizing a probability distribution associated with the received value acquired by the receiving means into a value expressed in a predetermined small number of bits, and message calculation means for calculating a message as information bits on the basis of the probability distribution associated with the received value quantized by the quantization means.

In this decoding apparatus according to the present invention, the receiving means receives a code coded on the basis of the degree sequence optimized such that the error probability after decoding is minimized for a given variance of noise or the allowable variance of noise is maximized for a given error probability after decoding, the quantization means quantizes the probability distribution associated with the received value acquired by the receiving means into a value expressed in a predetermined small number of bits, and the message calculation means acquires the decoded data by performing decoding on the basis of the probability distribution associated with the received value quantized by the quantization means.

To achieve the second object described above, the present invention also provides a decoding method of decoding a code coded by a coding method using a low density parity check code, the coding method comprising the steps of calculating a degree sequence indicating the distribution of the number of 1s in the parity check matrix, generating a parity check matrix on the basis of the degree sequence calculated in the degree sequence calculation step, coding the input data using the parity check matrix generated in the parity check matrix generation step, wherein in the degree sequence calculation step, the degree sequence is optimized such that the error probability after decoding is minimized for a given variance of noise or the allowable variance of noise is maximized for a given error probability after decoding, the decoding method comprising the steps of receiving transmitted data thereby acquiring a received value, quantizing a probability distribution associated with the received value acquired in the receiving step into a value expressed in a predetermined small number of bits, and calculating a message as information bits on the basis of the probability distribution associated with the received value quantized in the quantization processing step.

In this decoding method, a code, coded on the basis of the degree sequence optimized such that the error probability after decoding is minimized for a given variance of noise or the allowable variance of noise is maximized for a given error probability after decoding, is received, the probability distribution associated with the received value is quantized into a value expressed in a predetermined small number of bits, and decoding is performed on the basis of the quantized probability distribution associated with the received value.

BRIEF DESCRIPTION OF THE DRAWINGS

FIGS. 2A and 2B are diagrams showing quantization of an initial message, wherein FIG. 2A shows a probability distribution of the initial message and FIG. 2B shows a manner in which the probability distribution shown in FIG. 2A is quantized by dividing it into a plurality of zones;

FIG. 14 is a diagram showing an example of a sparse parity check matrix;

DESCRIPTION OF THE PREFERRED EMBODIMENTS

The present invention is described in further detail below with reference to preferred embodiments in conjunction with accompanying drawings.

Figure 1:
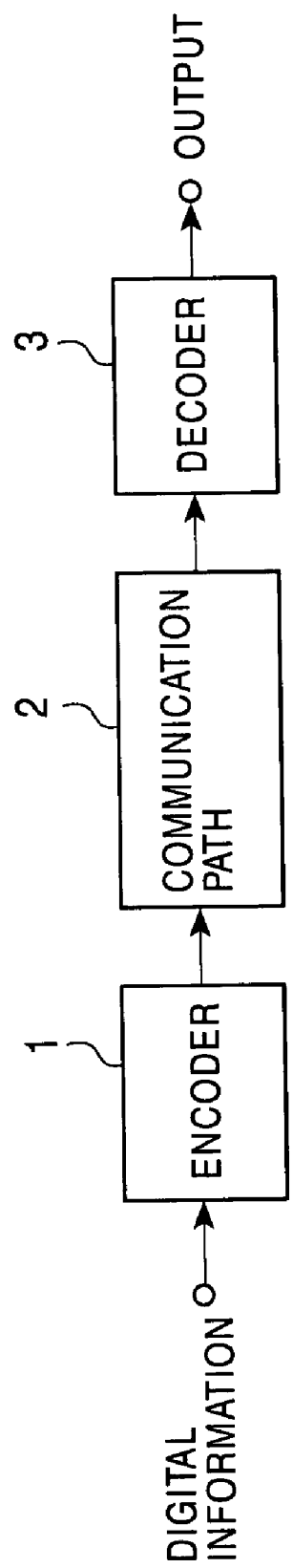
FIG. 1 is a block diagram showing a communication model of a data transmitting/receiving system according to an embodiment of the present invention.

In an embodiment, as shown in FIG. 1, the invention is applied to a communication model of a data transmitting/receiving system in which digital information is coded by a coding apparatus 1 disposed in a transmitter (not shown), and an output of the transmitter is transmitted to a receiver via a communication channel 2 having noise. In the receiver, a decoding apparatus 3 decodes the received digital information.

In this data transmitting/receiving system, the coding apparatus 1 is designed to encode digital information into low density parity check codes (hereinafter, referred to as LDPC codes). The coding apparatus 1 is featured by the capability of optimizing a degree sequence, which will be described later, such that high performance can be achieved when, in the decoding apparatus 3, a received value and messages passed among nodes are represented by a small number of bits.

The decoding apparatus 3 decodes a coded code received from the coding apparatus 1, by means of iterative decoding. The decoding apparatus 3 is featured by the capability of optimizing the quantization step size which is used when a received value and messages passed among nodes are quantized into small number of bits, thereby achieving high accuracy in decoding of LDPC codes.

Before details of the data transmitting/receiving system are described, guidelines for improvements in coding and decoding processes in the data transmitting/receiving system are discussed.

First, optimization of quantization in the decoding process is discussed.

Herein, the decoding process is analyzed on the basis of a density evolution method, the detailed description of which may be found, for example, in "On the design of low-density parity-check codes within 0.0045 dB of the Shannon limit" (Sae-Young Chung, G. David Forney, Jr., Thomas J. Richardson and Rudiger Urbanke, to appear in IEEE Communications Letters), for a case in which an initial message, that is, a received value, is represented in 3 bits and messages passed among nodes are represented in 2 bits.

First, analysis is performed for a case in which an irregular code (3, 6) is used, that is, for a case in which dv=3 and dc=6.

If a message output from a variable node is denoted by V, and a message output from a check node is denoted by U, the message V can be expressed by equation (9).

$$V = \sum_{j=0}^{dv-1} U_j \qquad (9)$$

where $U_o$ denotes an initial message, and $U_j$ (j=1, 2, ..., dv−1) denotes messages input from adjacent variable nodes. The message U can be expressed by equation (10).

$$\tanh\left(\frac{U}{2}\right) = \prod_{i=1}^{dc-1} \tanh\left(\frac{V_i}{2}\right) \qquad (10)$$

Figure 2B:
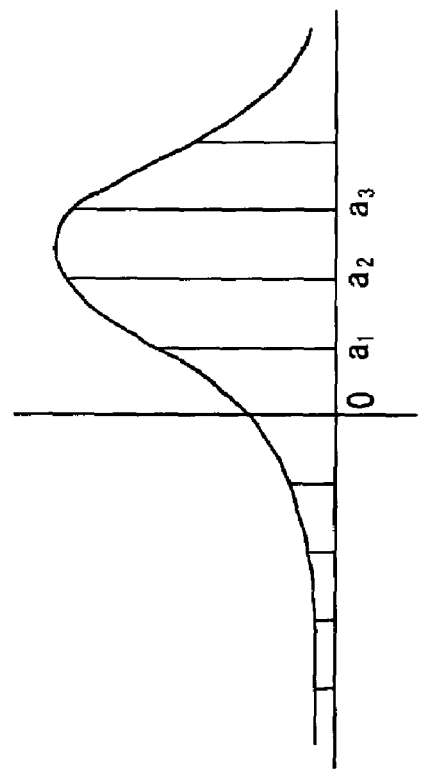
Figure 2A:
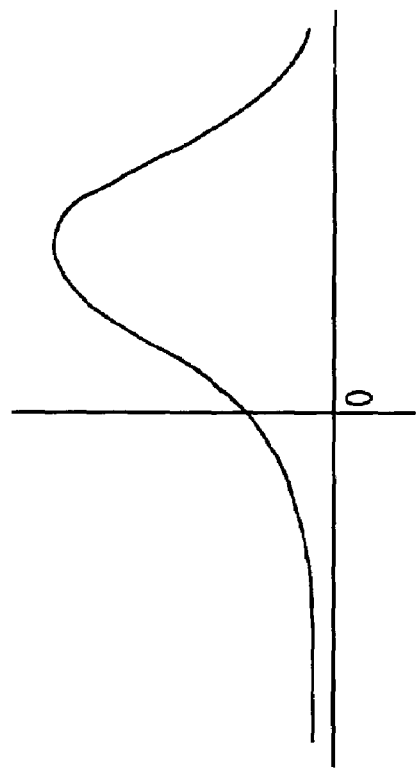

In a case in which the initial message expressed by a real number indicating a log likelihood ratio is quantized into a 3-bit value, positive and negative parts of the probability distribution of the initial message are respectively divided into 4 zones. For example, when the probability distribution of the initial message can be expressed as shown in FIG. 2A, the probability distribution is divided into 8 zones as shown in FIG. 2B. In FIGS. 2A and 2B, the horizontal axis represents the log likelihood ratio, and the vertical axis represents the probability distribution. In the positive part, the log likelihood ratio is divided by 3 boundaries. The values of the log likelihood ratio at those boundaries are denoted by $a_1$, $a_2$, and $a_3$, respectively, and quantization step sizes are defined by those values $a_1$, $a_2$, and $a_3$. The negative part is divided in a symmetrical manner to the positive part. Because the message $U_o$ is expressed in 3 bits, the message $U_o$ can have one of values from 0 to 7. The messages $U_j$ other than the initial message $U_o$ are each expressed in 2 bits, and thus they have one of values from 0 to 3.

In the density evolution, when dv=3, the probability distribution $P_{uo}(j)$ (j=0, 1, ..., 7) of the message $U_o$ and the probability distribution $P_v$ of the message $V_i$ are determined by calculating convolution according to equation (11) using the probability distribution $P_u(j)$ (j=0, 1, 2, 3) of messages $U_j$ input from check nodes.

$$P_v = P_{uo} * P_u * P_u \qquad (11)$$

where symbols * denote convolution.

The convolution in equation (11) can be accomplished by calculating the product of polynomials. The resultant determined probability distribution $P_v$ takes a value in the range from 0 to 13. In the density evolution, messages represented by the probability distributions $P_v$ are quantized into 2-bit values and output as a message V from a variable node.

The method of calculating equation (10) is described below. When dc=6, each variable node has five inputs and one output. The message $V_i$ output from an arbitrary variable node is represented in 2 bits, and thus the message $V_i$ takes a value in the range from 0 to 3, wherein when the log likelihood ratio is negative, the value is 0 or 1, while the value is 2 or 3 when the log likelihood ratio is positive. Therefore, at each variable node, if an odd number of input messages have a value of 0 or 1, then 0 or 1 is output. On the other hand, if an even number of input messages have a value of 0 or 1, 2 or 3 is output. In the case in which one or more messages have a value of 1 or 2, 1 or 2 is output. In the density evolution, when the above rule holds, the calculation is performed as follows.

First, a function R which gives one output corresponding to the message U in equation (10) for two given inputs is defined by equation (12).

$$V_3 = R(V_1, V_2) \quad (12)$$

A 2-bit message $V_3$ given by the function R expressed by equation (12) can be determined by referring to a prepared table such as that shown in Table 1

TABLE 1

Conversion table according to equation (12)

| $V_1$ | $V_2$ | | | |
|---|---|---|---|---|
| | 0 | 1 | 2 | 3 |
| 0 | 3 | 2 | 1 | 0 |
| 1 | 2 | 2 | 1 | 1 |
| 2 | 1 | 1 | 2 | 2 |
| 3 | 0 | 1 | 2 | 3 |

Thus, one output ($U_5$) for five inputs ($V_1$, $V_2$, $V_3$, $V_4$, and $V_5$) corresponding to equation (10) can be determined by iteratively calculating equation (12) using Table 1, as shown in equation (13).

$$U_5 = R(V_5, R(V_4, R(V_3, R(V_2, V_1)))) \quad (13)$$

In the density evolution, if the probability distribution of messages $V_1$ and $V_2$ are respectively denoted by $P_1(i)$ and $P_2(i)$ (i=0, 1, 2, 3), the calculation of equation (12) can be performed as shown in equation (14).

$$\begin{cases} P_3(0) = P_1(0)P_2(3) + P_1(3)P_2(0) \\ P_3(1) = P_1(0)P_2(2) + P_1(1)\{P_2(2) + P_2(3)\} + \\ \quad P_1(2)\{P_2(0) + P_2(1)\} + P_1(3)P_2(1) \\ P_3(2) = P_1(0)P_2(1) + P_1(1)\{P_2(0) + P_2(1)\} + \\ \quad P_1(1)\{P_2(2) + P_2(3)\} + P_1(3)P_2(2) \\ P_3(3) = P_1(0)P_2(0) + P_1(3)P_2(3) \end{cases} \quad (14)$$

In the density evolution, if the probability distribution of an input message V is denoted by $P_v$, the probability distribution $P_u$ of a message U corresponding to equation (13) is given by equation (15).

$$P_u = R(P_v, R(P_v, R(P_v, P_v))) \quad (15)$$

In the calculation of equation (14), it is needed to iteratively calculate equation (13) four times using Table 1. However, the same result can be obtained by performing a calculation three times if equations (16) to (18) are employed.

$$P_2 = R(P_v, P_v) \quad (16)$$

$$P_4 = R(P_2, P_2) \quad (17)$$

$$P_u = R(P_v, P_4) \quad (18)$$

The result of equation (18) is identical to the result of equation (15). Thus, in the density evolution, the 2-bit probability distribution $P_u$ can be determined from the probability distribution $P_v$.

On the basis of the density evolution described above, analysis was performed for the following three cases: 1) the initial message $U_o$ is expressed in 3 bits, and the quantization step size $a_1$, $a_2$, and $a_3$ are optimized; 2) the initial message $U_o$ is expressed in 3 bits, and the quantization step size $a_1$, $a_2$, and $a_3$ are equally spaced; and 3) the initial message $U_o$ is expressed in 2 bits, and only the quantization step size $a_1$ is optimized.

First, the result of analysis is described for the case in which the initial message $U_o$ is expressed in 3 bits, and the quantization step size $a_1$, $a_2$, and $a_3$ are optimized. In this analysis, the calculation was performed within the range of the log likelihood ratio from −25 to +25.

Figure 3:
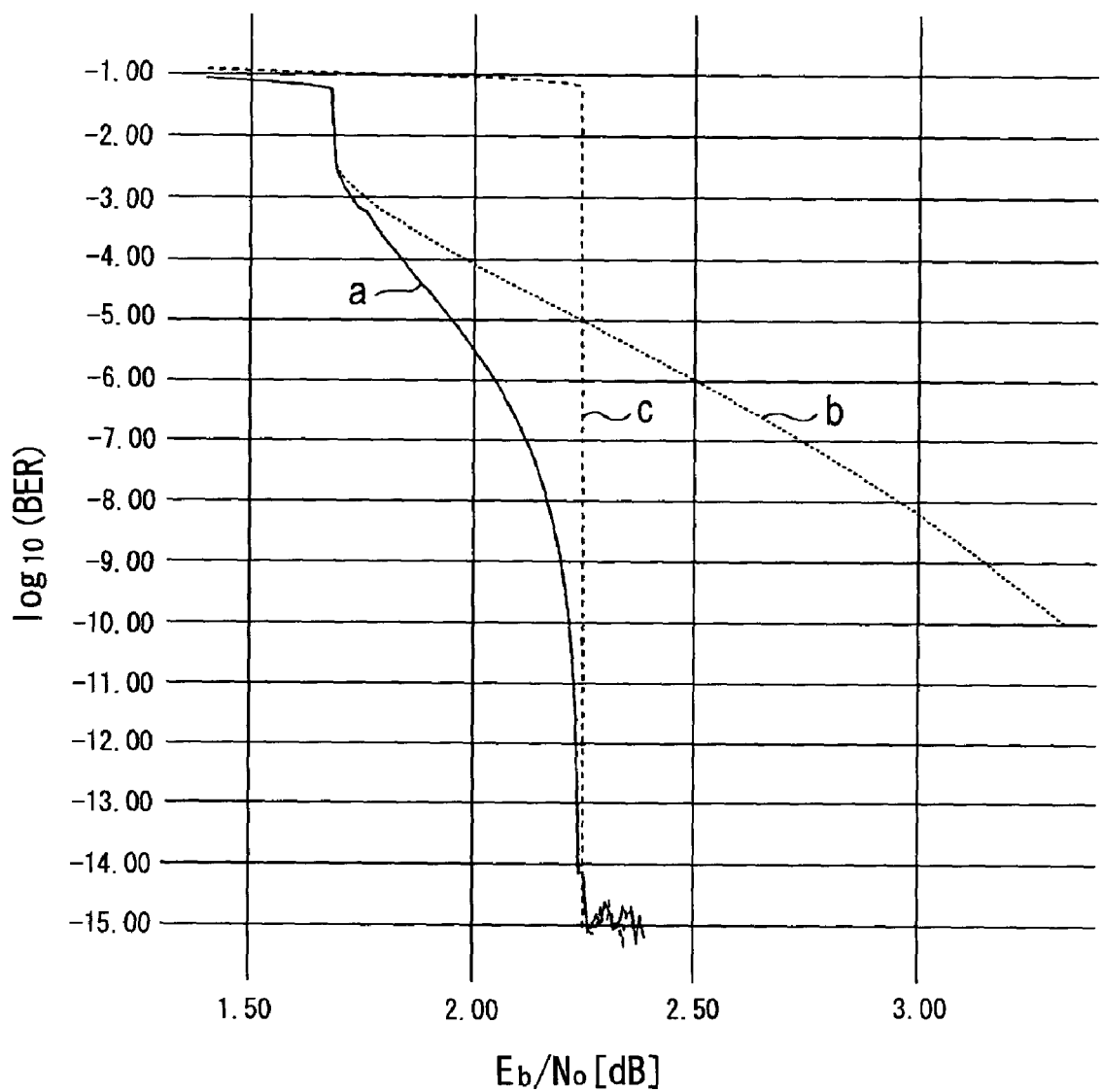
FIG. 3 is a graph showing a result of analysis of optimization of quantization step sizes, and more specifically, the error probability in logarithm of base 10 after decoding ($\log_{10}$ BER) is plotted as a function of the signal-to-noise power ratio $E_b/N_o$.

To represent the initial message $U_o$ in 3 bits, it is required to properly set the quantization step sizes $a_1$, $a_2$, and $a_3$. In this analysis, when the signal-to-noise power ratio $E_b/N_o$ (in dB) per bit is given or when the variance a is given, the quantization step sizes $a_1$, $a_2$, and $a_3$ are tried to be optimized so as to maximize the error correction performance. The solid line "a" in FIG. 3 represents the result of the analysis. In FIG. 3, the horizontal axis represents the signal-to-noise power ratio $E_b/N_o$, and the vertical axis represents the error probability in logarithm of base 10 after decoding ($\log_{10}$ BER). The variance σ of noise and the error rate $P_b$ before error correction are shown in Table 2 for some values of the signal-to-noise power ratio $E_b/N_o$ represented in the horizontal axis of FIG. 3.

TABLE 2

σ and Pb for particular values of $E_b/N_o$

| | $E_b/N_o$ | | | |
|---|---|---|---|---|
| | 1.50 | 2.00 | 2.50 | 3.00 |
| σ | 0.8414 | 0.7943 | 0.7499 | 0.7080 |
| $P_b$ | 0.1173 | 0.1040 | 0.0912 | 0.0789 |

As can be seen from FIG. 3, there is no clear threshold in the variance σ of noise. For example, when the variance σ of noise is 0.8237, the error probability $P_b$ is 0.1123 before error correction. After error correction, the error probability $P_b$ decreases to 0.004533, but the error probability $P_b$ does not reach 0. The above result was obtained when the quantization step sizes $a_1$, $a_2$, and $a_3$ were set to be 1.46, 2.91, and 4.57, respectively. In this specific case, the quantization step sizes $a_1$, $a_2$, and $a_3$ are nearly equally spaced, and they satisfy equation (19).

$$\begin{cases} a_2 \cong 2 \cdot a_1 \\ a_3 \cong 3 \cdot a_1 \end{cases} \quad (19)$$

It can be seen from FIG. 3 that although the error probability after error correction decreases with decreasing variance σ of noise, there is no threshold value below which the error probability becomes 0. As the variance σ of noise decreases, the quantization step sizes $a_1$, $a_2$, and $a_3$ greatly deviate from equally spaced values. For example, when σ=0.776, the error probability $P_b$ is 0.0988 before error correction, and the error probability is $5.94 \times 10^{-10}$ after error correction. The above result is obtained when the quantization step sizes $a_1$, $a_2$, and $a_3$ are set to be 1.75, 8.02, and 21.6, respectively. The probability distribution $P_V$ given by equation (11) can take a value in the range of 0 to 13, as described earlier. The probability distribution $P_v$ is quantized into a 2-bit value according to equation (20) shown below.

$$\begin{cases} V(0) = \sum_{i=0}^{5} P_v(i) \\ V(1) = P_v(6) \\ V(2) = P_v(7) \\ V(3) = \sum_{i=8}^{13} P_v(i) \end{cases} \quad (20)$$

A method of quantization according to equations $V(1)=P_v(6)+P_v(5)$ and $V(2)=P_v(7)+P_v(8)$ was also evaluated. However, this method resulted in great degradation in the error correction performance.

Now, optimization is discussed for the case in which the quantization step sizes $a_1$, $a_2$, and $a_3$ are equally spaced. In this analysis, the initial message $U_o$ was expressed in 3 bits as in the above analysis, and optimization was performed under an additional constraint that $a_2=2 \cdot a_1$ and $a_3=3 \cdot a_1$. In this case, therefore, the quantization step size $a_1$ is a sole parameter which was varied to so as to maximize the error correction performance. A broken line b in FIG. 3 represents the result of the analysis.

As can be seen from FIG. 3, in the range up to 1.8 dB in signal-to-noise power ratio $E_b/N_o$, the result is similar to that represented by the solid line an in the same figure. However, the error correction performance becomes worse in the range greater than 1.8 dB in signal-to-noise power ratio $E_b/N_o$.

Now, optimization is discussed for the case in which the initial message $U_o$ is expressed in 2 bits, and only the quantization step size $a_1$ is optimized so as to maximize the error correction performance. In this case, the positive part of the probability distribution of the initial message $U_o$ is divided two zones $U_o(2)$ and $U_o(3)$, and thus the positive part of the probability distribution of the initial message $U_o$ is divided by only one boundary having a value of $a_1$, which defines a quantization step size. A broken line c in FIG. 3 represents the result of optimization performed such that the error correction performance is maximized by adjusting only the quantization step size $a_1$.

As can be seen from FIG. 3, there is a threshold in variance σ at 0.7725. When the variance σ has the threshold value, the quantization step size $a_1$ is 1.755. In the case in which the probability distribution of the initial message $U_o$ is expressed in 2 bits, the probability distribution $P_v$ given by equation (11) takes a value in the range of 0 to 9. The probability distribution $P_v$ is quantized in accordance with $V(1)=P_v(4)$ and $V(2)=P_v(5)$ corresponding to equation (20) described above, wherein $V(0)$ is given by the sum of $P_v(0)$ to $P_v(3)$ and $V(3)$ is given by the sum of $P_v(6)$ to $P_v(9)$ From the result of the analysis, it can be concluded that the quantization step size used in decoding of LDPC codes can be optimized depending on the variance σ of noise. That is, in decoding of LDPC codes, it is desirable that the quantization step size used in quantization of an initial message and messages output from variable nodes be optimized so that the error probability after decoding becomes minimum for a given variance σ of noise. In other words, in decoding of LDPC codes, it is desirable that the quantization step sizes be set such that the allowable variance σ of noise is maximized for a given error probability after decoding.

On the basis of the above-described analysis, the decoding apparatus 3 of the receiver in the data transmitting/receiving system may be constructed as follows.

Figure 4:
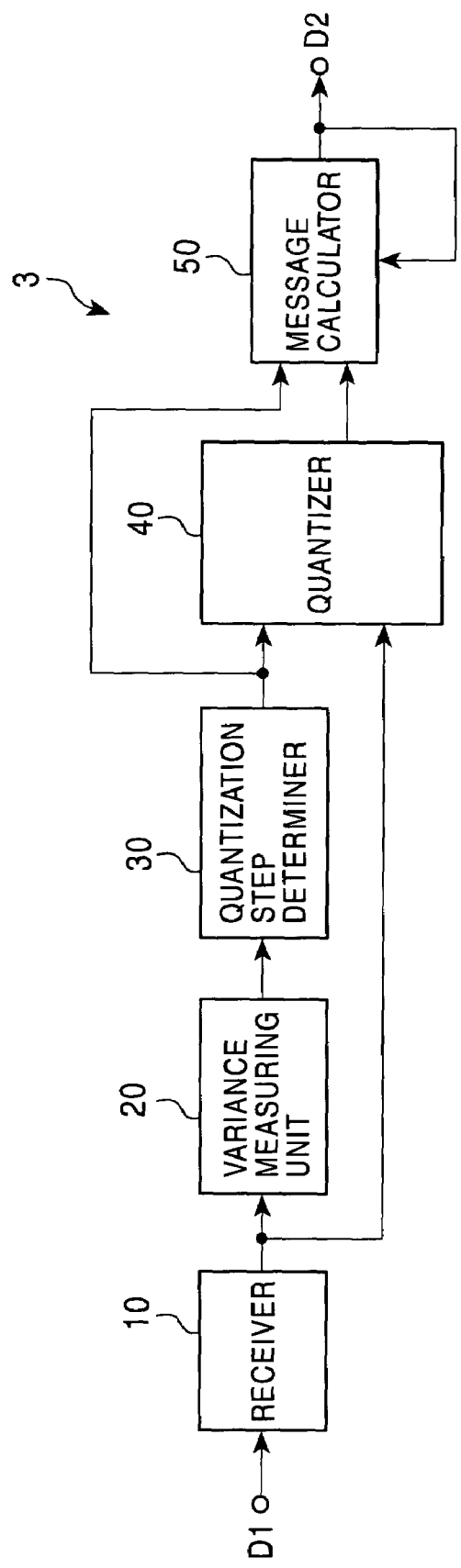
FIG. 4 is a block diagram showing a construction of a decoding apparatus in the data transmitting/receiving system.

For example, as shown in FIG. 4, the decoding apparatus 3 includes a receiving unit 10 for receiving data D1 transmitted from the transmitter via the communication channel 2, variance measuring unit 20 for measuring the variance σ of noise superimposed on the data D1 received by the receiving unit 10, a quantization step determiner 30 for determining an optimum quantization step size on the basis of the variance σ determined by the variance measuring unit 20, a quantizer 40 for quantizing the probability distribution $P_{uo}$ associated with the received value acquired by the receiving unit 10, and a message calculator 50 for calculating a message as information bits on the basis of the probability distribution $P_{uo}$ associated with the received value quantized by the quantizer 40. From the received value which takes a real number and which is influenced by noise generated on the communication channel 2, the decoding apparatus 3 estimates corresponding data input to the coding apparatus 1 and outputs the estimated data as decoded data D2.

The receiving unit 10 receives data D1, as the received value, transmitted from the transmitter via the communication channel 2. The receiving unit 10 supplies the received value to the variance measuring unit 20 and the quantizer 40.

The variance measuring unit 20 measures the variance σ of noise superimposed on the data D1 received by the receiving unit 10. The variance measuring unit 20 supplies information indicating the measured variance σ of noise to the quantization step determiner 30.

The quantization step determiner 30 determines optimized quantization step sizes on the basis of the variance σ of noise determined by the variance measuring unit 20. More specifically, the quantization step determiner 30 determines the quantization step sizes such that the error probability after decoding is minimized for the variance σ determined by the variance measuring unit 20. Alternatively, the quantization step determiner 30 may determine the quantization step sizes such that the allowable variance σ of noise is maximized for a given error probability after decoding. The quantization step determiner 30 supplies information indicating the quantization step sizes determined for the received value to the quantizer 40, and the quantization step determiner 30 supplies information indicating the quantization step sizes determined for messages output from variable nodes to the message calculator 50.

The quantizer 40 quantizes the probability distribution $P_{uo}$ associated with the received value acquired by the receiving unit 10 into a value using a predetermined small number of bits. For example, in the case in which messages are represented in 2 bits, the quantizer 40 quantizes the probability distribution $P_{uo}$ associated with the received value into a 3-bit value. In this quantization process, the quantizer 40 employs the quantization step sizes determined by the quantization step determiner 30. The quantizer 40 supplies the resultant quantized received value to the message calculator 50.

The message calculator 50 calculates messages output from variable nodes on the basis of the received value supplied from the quantizer 40. Furthermore, on the basis of those messages, the message calculator 50 calculates messages output from check nodes by iteratively performing a decoding process a predetermined number of time thereby obtaining a final message as information bits. More specifically, the message calculator 50 calculates the messages by performing a sequence of processing steps shown in FIG. 5.

Figure 5:
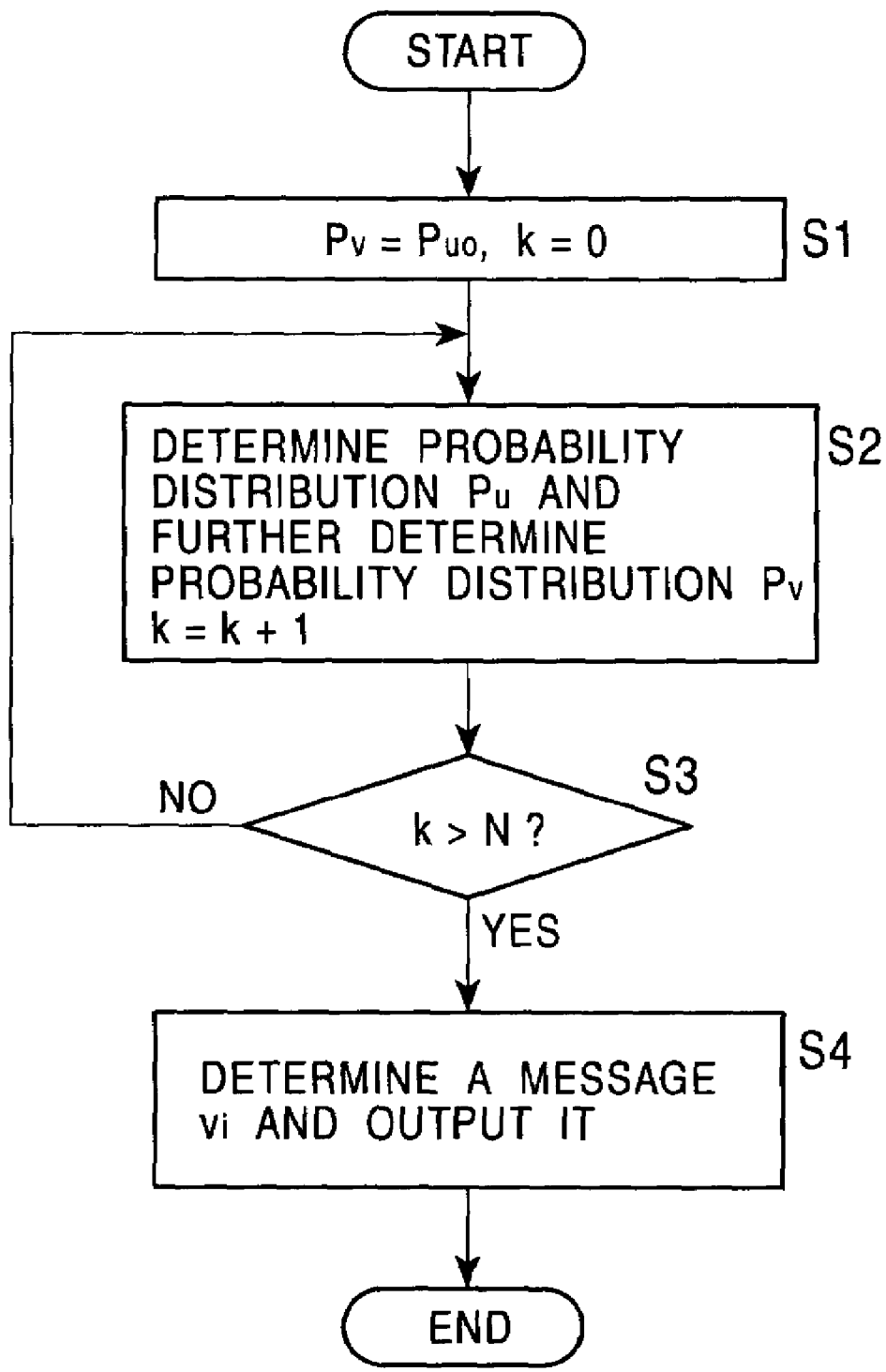
FIG. 5 is a flow chart of a process of calculating a message and outputting the calculating message, performed by a message calculator of the decoding apparatus.

First, in step S1 in FIG. 5, the message calculator 50 further quantizes the probability distribution $P_{uo}$ associated with the received value quantized by the quantizer 40 thereby producing a probability distribution $P_v$ associated with a message $V_i$ output from the variable node. The message calculator 50 then sets an integer k to 0, wherein the integer k is a counter value indicating the number of times the process is iterated. For example, in the case in which messages are represented by 2 bits, the message calculator 50 quantizes the 3-bit quantized value of the probability distribution $P_{uo}$ associated with the received value into a 2-bit value indicating the probability distribution $P_v$.

In the next step S2, the message calculator 50 determines the probability distribution $P_u$ associated with a message $u_j$ output from a check node on the basis of the probability distribution $P_v$. The message calculator 50 further determines the probability distribution $P_v$ associated with a message $v_i$ by calculating equation (11) on the basis of the probability distribution $P_{uo}$ associated with the received value and the probability distribution $P_u$ associated with the message $u_j$. Furthermore, in step S2 in the LDPC decoding process, the integer k is incremented by 1.

In the above process, the message calculator 50 prepares a function table indicating the conversion from two inputs $v_1$ and $v_2$ expressed by the small number of bits into one output expressed by the small number of bits, and the message calculator 50 determines the probability distribution $P_u$ associated with the message $u_j$ expressed by the small number of bits by iteratively applying the conversion rule as shown in equation (15). If the probability distribution $P_v$ associated with the message $v_i$ is determined in accordance with equation (11), the number of bits increases. Thus, the message calculator 50 quantizes the probability distribution $P_v$ into 2 bits. In this quantization process, the message calculator 50 employs the quantization step size determined by the quantization step determiner 30.

In the next step S3, the message calculator 50 determines whether the integer k is greater than N.

If the message calculator 50 determines that the integer k is not greater than N, the message calculator 50 returns the process to step S2 to repeat step S2 and following steps. However, if it is determined that the integer k is greater than N, the message calculator 50 advances the process to step S4.

In step S4, the message calculator 50 determines a message $v_i$ indicating a final result of decoding and outputs it. Thus, the process is completed.

The message calculated by the message calculator 50 via the process described above is output as decoded data D2 to the outside.

The decoding apparatus 3 iteratively performs decoding on the data D1 coded and transmitted by the coding apparatus 1 thereby improving the performance of the code with high decoding complexity. The decoding apparatus 3 outputs the decoded data D2 obtained after the decoding process is iteratively performed the predetermined number of times.

In the above decoding process performed in the decoding apparatus 3, the quantization step determiner 30 determines the quantization step size such that the error probability after decoding is minimized for the variance σ of noise determined by the variance measuring unit 20, and the determined quantization step size is employed by the quantizer 40 to quantize the received value and by the message calculator 50 to quantize messages into values expressed in a small number of bits corresponding to the determined quantization step size.

Thus, the decoding apparatus 3 has high decoding performance, which allows data to be decoded accurately.

Now, optimization of the degree sequence in the process of coding irregular LDPC codes is discussed.

In irregular LDPC codes, a parity check matrix is defined by a degree sequence. The degree sequence indicates the distribution of number of 1s in the parity check matrix. The distribution of the number of 1s in the vertical direction (in columns) of the parity check matrix is represented by a function λ(x) given by equation (21) and the distribution of the number of 1s in the horizontal direction (in rows) of the parity check matrix is represented by a function ρ(x) given by equation (22).

$$\lambda(x) = \Sigma \lambda_i x^{n_i} \quad (21)$$

$$\rho(x) = \Sigma \rho_i x^{m_i} \quad (22)$$

Herein, the degree $n_i$ of the function λ(x), which corresponds to dv indicating the number of 1s in the vertical direction (in columns) in the parity check matrix of irregular LDPC codes is limited to odd numbers. This is because, if the degree $n_i$ is even, an odd number of probability distributions $P_u$ are involved in the convolution operation shown in equation (11), and thus the log likelihood ratio can be equal to 0, which creates a possibility that quantization into 2 bits becomes impossible. In contrast, the degree $m_i$ of the function ρ(x), which corresponds to dc indicating the number of 1s in the horizontal direction (in rows) in the parity check matrix of irregular LDPC codes can be odd or even. The λ(x) is expressed by a polynomial in the form of the sum of two terms as shown in equation (23) wherein one of two degrees $n_i$ is set to be 3 and the other to an arbitrary odd number. The ρ(x) is also expressed by a polynomial in the form of the sum of two terms as shown in equation (24). In equation (23), a coefficient λ(3) indicates the ratio of the number of columns having three 1s to the total number of columns of the parity check matrix, and a coefficient λ(n) indicates the ratio of the number of columns having as many is as n to the total number of columns of the parity check matrix. In equation (24), a coefficient ρ(m) indicates the ratio of the number of rows having as many 1s as m to the total number of rows of the parity check matrix, and a coefficient ρ(m+1) indicates the ratio of the number of rows having as many is as m+1 to the total number of rows of the parity check matrix.

$$\lambda(x) = \lambda(3)x^3 + \lambda(n)x^n$$

where $\lambda(3) + \lambda(n) = 1$ (23)

$$\rho(x) = \rho(m)x^m + \rho(m+1)x^{m+1}$$

where $\rho(m) + \rho(m+1) = 1$ (24)

In a case in which the coding rate is ½, an additional condition given by equation (25) is imposed.

$$\frac{1}{2}[(\lambda(3)/3) + (\lambda(n)/n)] = [(\rho(m)/m) + (\rho(m+1)/(m+1))] \quad (25)$$

In addition to the above conditions, if the value of a parameter dc(ave) indicating the mean value of the numbers of 1s in the horizontal direction (in rows) in the parity check matrix is given as shown in equation (26), then coefficients $\lambda(3)$, $\lambda(n)$, $\rho(m)$, and $\rho(m+1)$ in equations (23) and (24) can be determined.

$$dc(ave) = \rho(m)m + \rho(m+1)(m+1) \quad (26)$$

Specific examples of analysis we performed are described below. The analysis was performed for each of four values of n=9, 11, 13, and 15, while m was fixed at 6.

Figure 6:
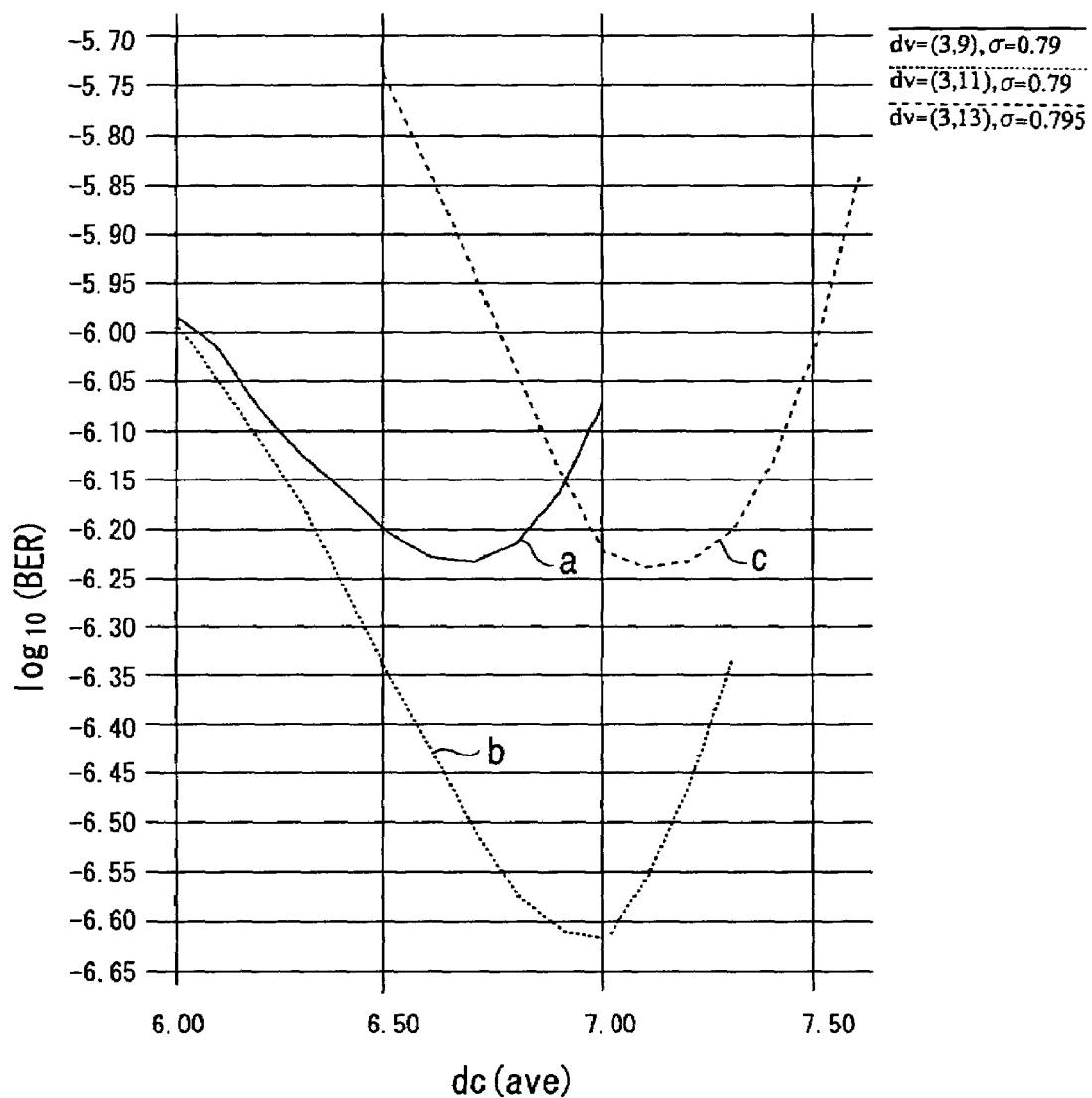
FIG. 6 is a graph showing a result of analysis on the dependence of a parameter dc(ave) on the error probability in logarithm of base 10 after decoding ($\log_{10}$ BER) for a given variance σ, when an irregular code is decoded.

First, the result of analysis is described for the case in which n was set to 9, the variance σ of noise was fixed at 0.79 and the parameter dc(ave) given by equation (26) was varied in the range of 6 to 7. A solid line an in FIG. 6 represents the result of the error probability after decoding calculated as a function of the parameter dc(ave). In FIG. 6, the horizontal axis represents the parameter dc(ave), and the vertical axis represents the error probability in logarithm of base 10 after decoding ($\log_{10}$ BER)

When n=9, the probability distribution $P_v$ given by equation (11) can take a value in the range from 0 to 31. When the probability distribution $P_v$ was quantized into two bits, quantization was performed using equation (27) in which each of V(1) and V(2) is expressed by the sum of two terms of probability distributions $P_v$, instead of equation (20).

$$\begin{cases} V(0) = \sum_{i=0}^{13} P_v(i) \\ V(1) = P_v(14) + P_v(15) \\ V(2) = P_v(16) + P_v(17) \\ V(3) = \sum_{i=18}^{31} P_v(i) \end{cases} \quad (27)$$

As can be seen from FIG. 6, the error probability after error correction becomes smallest when the parameter dc(ave) is equal to 6.67.

Figure 7:
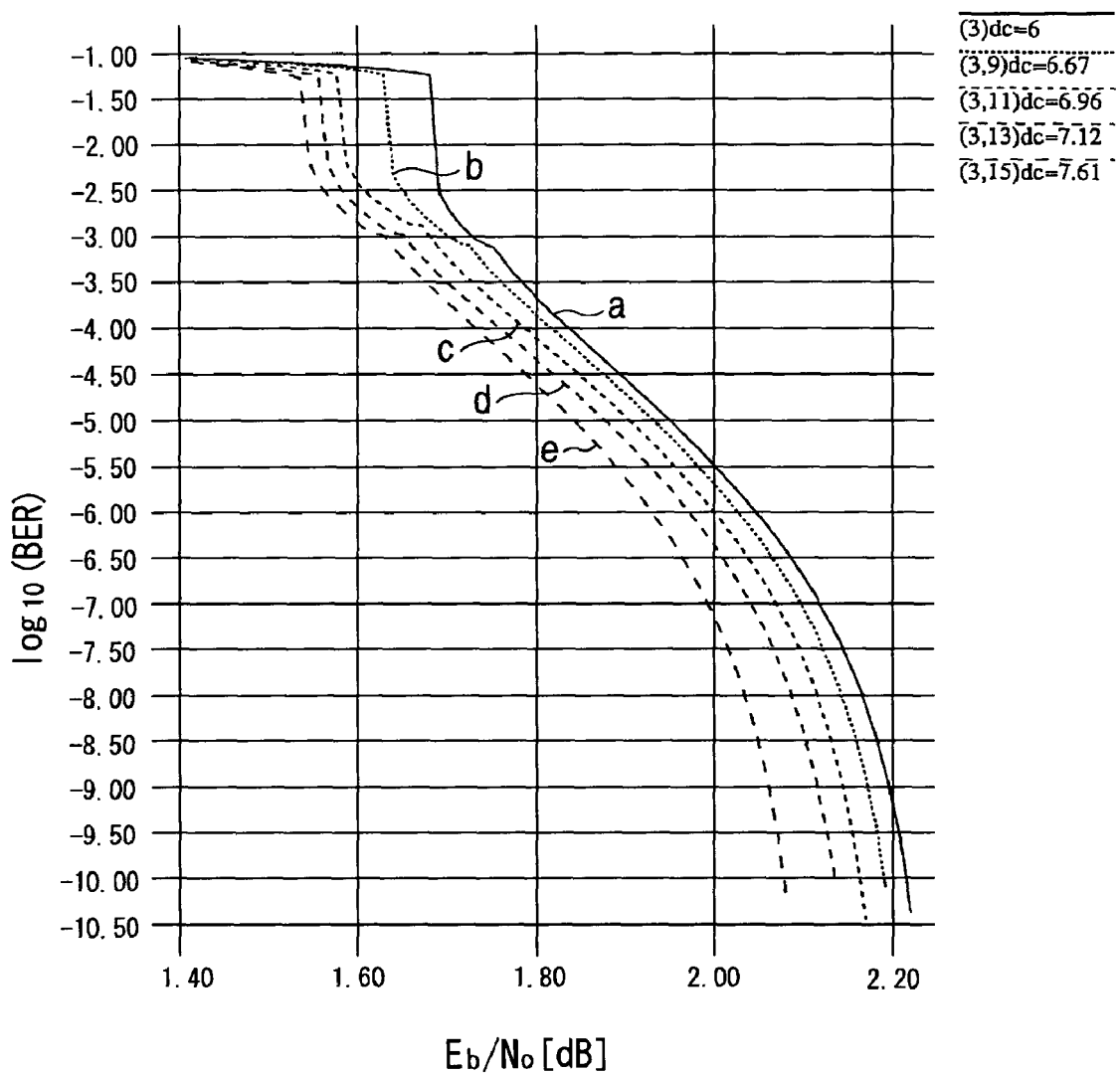
FIG. 7 is a graph showing the calculated error probability in logarithm of base 10 after decoding ($\log_{10}$ BER) obtained when an irregular code coded with a fixed parameter dc(ave) is decoded, as a function of the signal-to-noise power ratio $E_b/N_o$.

A broken line b in FIG. 7 represents the error probability in logarithm of base 10 after decoding ($\log_{10}$ BER) calculated as a function of the signal-to-noise power ratio $E_b/N_o$, for the case in which the parameter dc(ave) was set to be 6.67. The variance σ of noise and the error probability $P_b$ before error correction are shown in Table 3 for some values of the signal-to-noise power ratio $E_b/N_o$ represented in the horizontal axis of FIG. 7. In FIG. 7, a solid line a represents the result for the case in which the parameter dc(ave) was set to be 6, that is, for the case in which decoding was performed on regular (3, 6) codes.

TABLE 3

σ and Pb for particular values of $E_b/N_o$

| | $E_b/N_o$ | | | | |
|---|---|---|---|---|---|
| | 1.40 | 1.60 | 1.80 | 2.00 | 2.20 |
| σ | 0.8511 | 0.8318 | 0.8128 | 0.7943 | 0.7763 |
| $P_b$ | 0.12 | 0.1146 | 0.1093 | 0.1040 | 0.0988 |

It can be seen from FIG. 7 that irregular codes with a parameter dc(ave)=6.67 have higher performance than regular (3, 6) codes.

The result of analysis for n=11 and 13 is described below. In the case of n=11, the variance σ of noise was fixed at 0.79, and the parameter dc(ave) was varied. In the case of n=13, the variance σ of noise was fixed at 0.795, and the parameter dc(ave) was varied. A broken line b in FIG. 6 represents the error probability after decoding calculated as a function of the parameter dc(ave) for n=11, and broken line c represents the result for n=13. In the analysis for both n=11 and n=13, quantization of the probability distribution $P_v$ into 2 bits was performed using V(1) and V(2) each given by the sum of two terms of probability distribution $P_v$ as shown in equation (27).

It can be seen from FIG. 6, the error probability after error correction for n=11 becomes smallest when the parameter dc(ave) is equal to 6.96, and the error probability after error correction for n=13 becomes smallest when the parameter dc(ave) is equal to 7.12.

In view of the above result, the parameter dc(ave) was fixed at 6.96 or 7.12, and the error probability in logarithm of base 10 after decoding ($\log_{10}$ BER) was calculated as a function of the signal-to-noise power ratio $E_b/N_o$. Broken lines c and d in FIG. 7 represent the results for n= 6.96 and n=7.12, respectively.

As can be seen from FIG. 7, the performance increases with the degree n.

Figure 8:
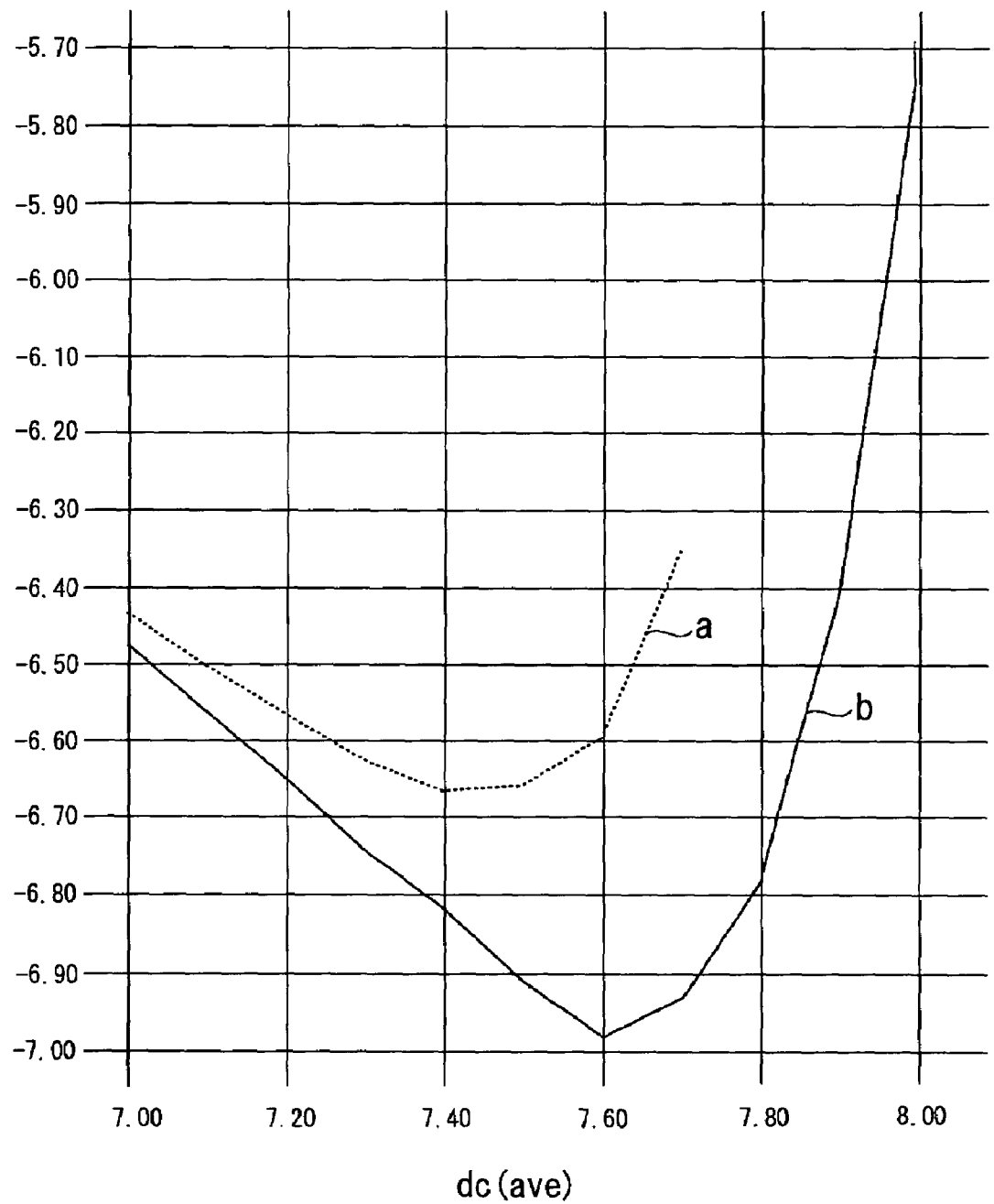
FIG. 8 is a graph showing the calculated error probability in logarithm of base 10 after decoding ($\log_{10}$ BER) obtained when an irregular code is decoded, as a function of the parameter dc(ave), in which the variance σ of noise is assumed to be constant, wherein the error probability after decoding is calculated for both cases in one of which V(1) and V(2) expressed by the sum of two terms are used in quantization of the probability distribution $P_v$ and in the other one of which V(1) and V(2) expressed by the sum of three terms are used in quantization of the probability distribution $P_v$.

Finally, the analysis for n=15 is described. In this analysis, the performance was evaluated for the two cases in one of which V(1) and V(2) used in quantization of the probability distribution $P_v$ given equation (11) were each represented by the sum of two terms of probability distribution $P_v$, and in the other one of which V(1) and V(2) were each represented by the sum of three terms of probability distribution $P_v$. In both cases, the variance a of noise was fixed at 0.795 and the parameter dc(ave) was varied in the range from 7 to 8. A broken line in FIG. 8 represents the result of analysis for the case in which V(1) and V(2) were each represented by the sum of two terms of probability distribution $P_v$, and a solid line b represents the result of analysis for the case in which V(1) and V(2) were each represented by the sum of three terms of probability distribution $P_v$. In FIG. 8, the horizontal axis represents the parameter dc(ave), and the vertical axis represents the error probability in logarithm of base 10 after decoding ($\log_{10}$ BER).

It can be seen from FIG. 8 that if each of V(1) and V(2) is represented by the sum of three terms of probability distributions $P_v$, better performance is achieved, and the error probability after error correction becomes minimum when the parameter dc(ave) is set to be 7.61.

In view of the above result of analysis, V(1) and V(2) were each represented by the sum of three terms of probability distributions $P_v$ and the parameter dc(ave) was fixed at 7.61, and the error probability in logarithm of base 10 after decoding ($\log_{10}$ BER) was calculated as a function of the signal-to-noise power ratio $E_b/N_o$. A broken line e in FIG. 7 represents the result of analysis.

As can be seen from FIG. 7, the performance increases with the degree n.

From the above discussion, it can be concluded that irregular codes have greater performance than regular codes, and the performance of irregular codes increases with the greatest degree n of the function $\lambda(x)$ representing the degree sequence.

The performance obtained when the greatest degree n of the function $\lambda(x)$ is further increased is discussed below. Furthermore, a difference between the performance achieved when the function $\lambda(x)$ is expressed by a polynomial of two terms and that achieved when the function $\lambda(x)$ is expressed by a polynomial of three terms is also discussed.

First, the performance is discussed for the case in which the function $\lambda(x)$ is expressed by a polynomial of two terms, that is, for the case in which the degree sequence in the vertical direction (in columns) of the parity check matrix is represented by equation (23). Herein, the degree sequence in the horizontal direction (in rows) of the parity check matrix is represented by the function $\rho(x)$ given by equation (24).

In the density evolution, when the function $\lambda(x)$ is expressed by equation (23), the probability distribution corresponding to term $x^3$ can be determined using equations (11) and (20). On the other hand, in the density evolution, the convolution operation on the terms $x^n$ can be accomplished by means of fast Fourier transform (hereinafter, referred to as FFT). As a result of the convolution operation, the values of $P_v(0)$ to $P_v(nf)$ (nf=7+3(n-1)) are obtained. Each of those values is then quantized into 2 bits. When the degree n is large, higher performance is obtained if each of V(1) and V(2) in equation (20) is represented by two terms in the quantization than can be obtained when each of V(1) and V(2) is represented by one term. The dependence of the performance on the number of terms, k, included in each of V(1) and V(2) used in quantization is discussed below.

In this analysis, the quantization step sizes $a_1$, $a_2$, and $a_3$ used in quantization of the initial message $U_o$ into a value expressed in 3 bits were optimized in all cases, and the variance $\sigma$ of noise was determined which was obtained when a particular value of the error probability was obtained as a result of iterative decoding. More specifically, for a given degree n of the function $\lambda(x)$, the coefficient $\lambda(n)$ in equation (23) was optimized such that the variance $\sigma$ of noise, allowable to obtain $10^{-3}$ or $10^{-6}$ in error probability after iterative decoding, was maximized.

Figure 9:
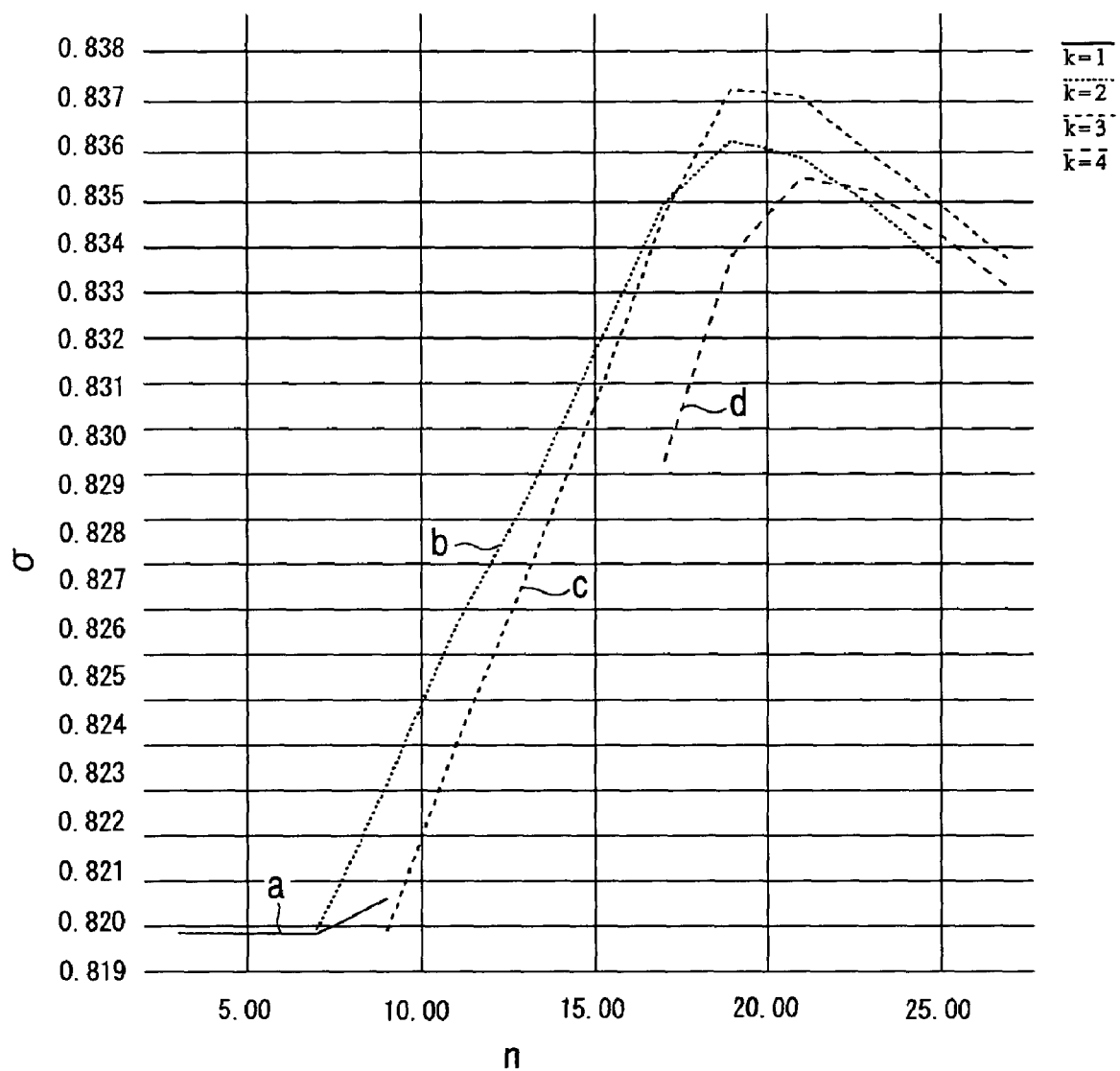
FIG. 9 is a graph showing the calculated variance σ of noise allowable to achieve an error probability of $10^{-3}$ after decoding, as a function of the degree n associated with the function λ(x)

The result of the analysis is shown in FIG. 9. That is, FIG. 9 shows the variance $\sigma$ of noise allowable to obtain an error probability of $10^{-3}$ after decoding as a function of the degree n. In FIG. 9, a solid line an and broken lines b, c, and d represent performance obtained when k=1, 2, 3, and 4, respectively, wherein k is a parameter indicating the number of terms of each of V(1) and V(2) used in quantization of the probability distribution $P_v$ into 2 bits.

It can be seen from FIG. 9 that a greatest improvement in performance can be achieved when k=3. More specifically, when k=3, the allowable variance $\sigma$ of noise increases with increasing n in the range up to 19, and thus the error correction performance is improved. However, in the range of n greater than 19, the allowable variance $\sigma$ of noise decreases, and the error correction performance is degraded. From the result of the analysis, it can be concluded that, when an error probability of $10^{-3}$ is allowed after error correction, the best error correction performance is obtained when the number of terms k is 3 and the degree n is 19.

When the number of terms k is set 3 and the degree n is set to 19, the maximum allowable variance $\sigma$ of noise is 0.8371 ($E_b/N_o$=1.54 dB). In this specific case, the coefficient $\lambda(n)$ is 0.3088, and the mean value $\rho$(ave) of the numbers of 1s in the horizontal direction (in rows) in the parity check matrix is 8.1270.

Figure 10:
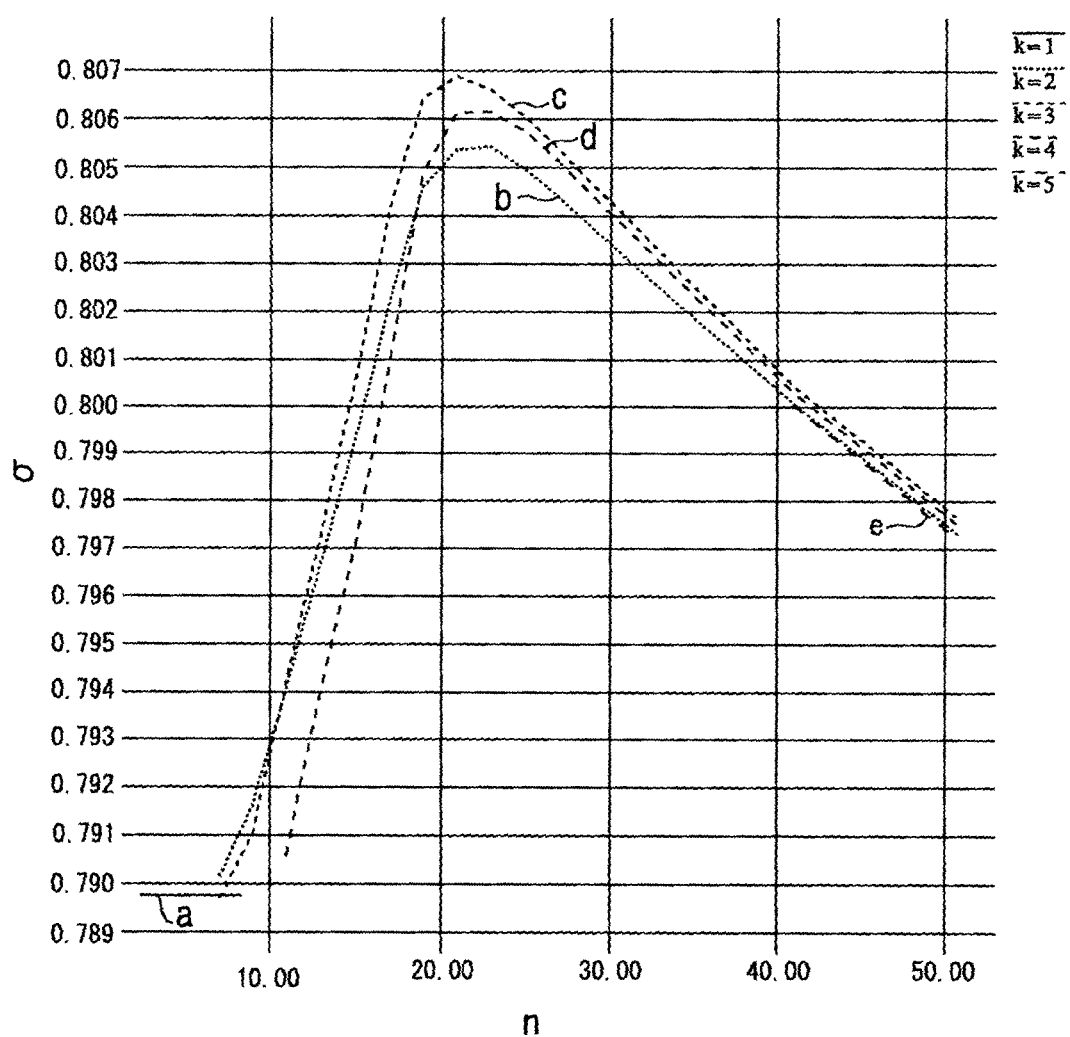
FIG. 10 is a graph showing the calculated variance σ of noise allowable to achieve an error probability of $10^{-6}$ after decoding, as a function of the degree n associated with the function λ(x)

FIG. 10 shows the variance $\sigma$ of noise allowable to obtain an error probability of $10^{-6}$ after decoding as a function of the degree of n. In this figure, a solid line an and broken lines b, c, d, and e represent performance obtained when k=1, 2, 3, 4, and 5, respectively, wherein k is a parameter indicating the number of terms of each of V(1) and V(2) used in quantization of the probability distribution $P_v$ into 2 bits.

It can be seen from FIG. 10 that in the range of the degree n greater than 11, a greatest improvement in performance can be achieved when k=3. More specifically, when k=3, the allowable variance $\sigma$ of noise increases with increasing n in the range up to 21, and thus the error correction performance is improved. However, in the range of n greater than 21, the allowable variance $\sigma$ of noise decreases, and the error correction performance is degraded. From the result of the analysis, it can be concluded that, when an error probability of $10^{-6}$ is allowed after error correction, the best error correction performance is obtained when the number of terms k is 3 and the degree n is 21. When the number of terms k is set 3 and the degree n is set to 21, the maximum allowable variance $\sigma$ of noise is 0.8068 ($E_b/N_o$=1.864 dB). In this specific case, the coefficient $\lambda(n)$ is 0.3010, and the mean value $\rho$(ave) of the numbers of 1s in the horizontal direction (in rows) in the parity check matrix is 8.096.

As described above, when the function $\lambda(x)$ is expressed in the form of a polynomial including two terms, the degree n has a threshold at which the error correction performance becomes greatest.

Now, optimization is discussed for the case in which the function $\lambda(x)$ is expressed in the form of a polynomial including three terms, that is, for the case in which the degree sequence in the vertical direction in columns of the parity check matrix is expressed by equation (28). In this case, the degree sequence in the horizontal direction (in rows) of the parity check matrix is assumed to be expressed by the function $\rho(x)$ given by equation (24). Furthermore, the degrees $n_1$ and $n_2$ in equation (28) are assumed to be odd.

$$\lambda(x)=\lambda(3)x^3+\lambda(n_1)x^{n_1}+\lambda(n_2)x^{n_2}$$

$$\text{where } \lambda(3)+\lambda(n_1)+\lambda(n_2)=1 \tag{28}$$

In a case in which the coding rate is ½, an additional condition given by equation (29) is imposed.

$$\frac{1}{2}[(\lambda(3)/3)+(\lambda(n_1)/n_1)+(\lambda(n_2)/n_2)]=[(\rho(m)/m)+(\rho(m+1)/(m+1))] \tag{29}$$

The degree m in the function $\rho(x)$ can be determined as an integer m which satisfies $0<\rho(m)<1$ for given coefficients $\lambda(n_1)$ and $\lambda(n_2)$ in equation (29).

In the actual analysis we performed, in the calculation of the function $\lambda(x)$ given by equation (28), the probability distribution corresponding to the term $x^3$ was determined using equations (11) and (12), and the convolution associated with $x^{n_1}$ and $x^{n_2}$ was performed by means of FFT. When the probability distribution was quantized into 2 bits, V(1) and V(2) were expressed by the sum of three terms (k=3) when the degrees $n_1$ and $n_2$ were greater than 11 so that best performance was obtained when the function $\lambda(x)$ was expressed by the sum of two terms.

In the analysis, for given values of the degrees $n_1$ and $n_2$, the coefficients $\lambda(n_1)$ and $\lambda(n_2)$ in equation (28) were optimized such that the variance $\sigma$ of noise allowable to achieve an error probability of $10^{-6}$ after iterative decoding was maximized.

Figure 11:
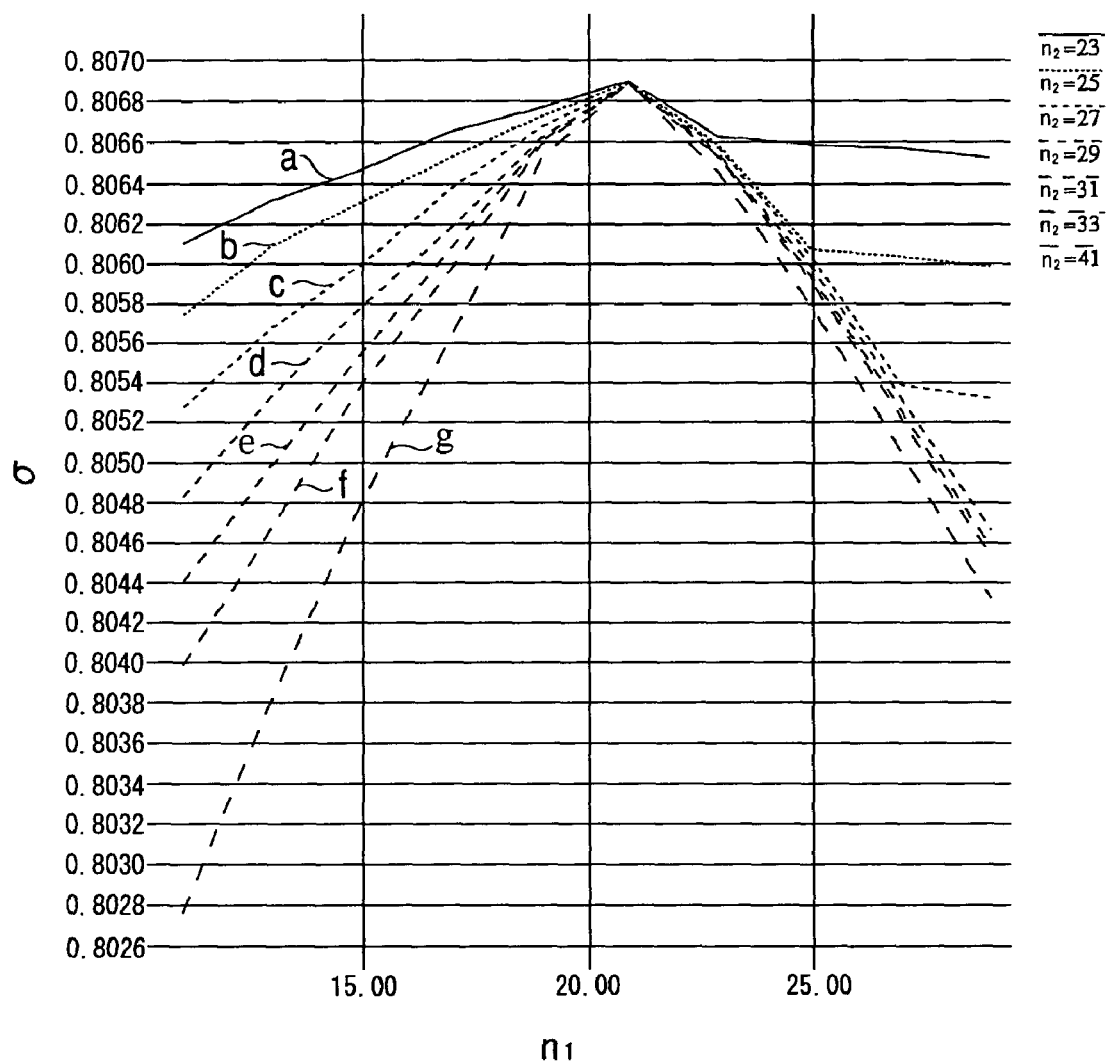
FIG. 11 is a graph showing the calculated variance σ of noise allowable to achieve an error probability of $10^{-6}$ after decoding, as a function of the degree n, associated with the function λ(x), for various values of the degree $n_2$ associated with the function λ(x)

FIG. 11 shows the result of calculation of the variance $\sigma$ of noise allowable to obtain an error probability of $10^{-6}$ after decoding, as a function of the degree $n_1$ for various values of the degree $n_2$. In FIG. 11, a solid line 1 and broken lines b, c, d, e, f, and g represent the results for $n_2$=23, 25, 27, 29, 31, 33, and 41, respectively.

It can be seen from FIG. 11, the performance is most improved when $n_1$=21. When $n_1$=21, the same maximum allowable variance $\sigma$ of noise is obtained regardless of the value of the degree $n_2$. More specifically, the allowable variance $\sigma$ of noise increases with increasing $n_1$ in the range up to 21, and thus the error correction performance is improved. However, in the range of $n_1$ greater than 21, the allowable variance $\sigma$ of noise decreases, and the error correction performance is degraded. From the result of the analysis, it can be concluded that, when an error probability of $10^{-6}$ is allowed after error correction, the best error correction performance is obtained when the number of terms k is 3 and the degree $n_1$ is 21. When the number of terms k is set 3 and the degree $n_1$ is set to 21, the maximum allowable variance $\sigma$ of noise is 0.8068 ($E_b/N_o$=1.864 dB). In this specific case, the coefficient $\lambda(n_2)$ is 0. This result is identical to that obtained for $n_1$=21 when the function $\lambda(x)$ was expressed by the polynomial in the form of the sum of two terms shown in FIG. 10.

In view of the above result, $n_2$ was fixed at 21 and the variance $\sigma$ of noise allowable to achieve an error probability of $10^{-6}$ after decoding was calculated as a function of the degree $n_1$. The result of the calculation shows, although not shown in the figures, that the allowable variance $\sigma$ of noise increases when the coefficient $\lambda(n_1)$ is negative, and the allowable variance $\sigma$ of noise decreases when the coefficient $\lambda(n_1)$ is positive. That is, the best performance is achieved when the coefficient $\lambda(n_1)$ is set to be 0. This corresponds to the case in which the function $\lambda(x)$ shown in FIG. 10 is expressed by a polynomial of two terms.

In conclusion, when an error probability of $10^{-6}$ is allowed after error correction, the maximum allowable variance $\sigma$ of noise is obtained if the functions $\lambda(x)$ and $\rho(x)$ are respectively given by equations (30) and (31).

$$\lambda(x) = 0.6990x^3 + 0.3010x^{21} \quad (30)$$

$$\rho(x) = 0.9040x^8 + 0.0960x^9 \quad (31)$$

In this case, the quantization step sizes $a_1$, $a_2$, and $a_3$ used in quantization of the initial message $U_o$ into 3 bits are respectively 1.609, 5.542, and 24.124.

As described above, when the function $\lambda(x)$ is expressed by a polynomial of three terms, the degree $n_1$ also has a threshold at which the error correction performance becomes maximum. However, the maximum allowable variance $\sigma$ of noise achieved when the function $\lambda(x)$ is expressed by the polynomial of three terms cannot be greater than the maximum allowable variance $\sigma$ of noise achieved when the function $\lambda(x)$ is expressed by the polynomial of two terms. This means that the function $\lambda(x)$ expressed by the polynomial of two terms is sufficient for the present purpose.

From the result of the analysis, it can be concluded that when irregular LDPC codes are used, there is an optimum degree sequence and there are optimum quantization step sizes used in decoding depending on the value of variance $\sigma$ of noise. Therefore, in LDPC codes, it is desirable that the degree sequence and the quantization step sizes be set such that the error probability after decoding is minimized for a given variance $\sigma$ of noise. In other words, in LDPC codes, it is desirable that the degree sequence and the quantization step sizes be set such that the allowable variance $\sigma$ of noise is maximized for a given error probability after decoding.

More specifically, the function $\lambda(x)$, by which the degree sequence in the vertical direction (in columns) of the parity check matrix is represented, can be optimized for a given variance $\sigma$ of noise or for a given error probability after decoding, while fixing the degree $m_i$ of the function $\rho(x)$ by which the degree sequence in the horizontal direction (in rows) of the parity check matrix is represented. At the same time, the quantization step sizes $a_1$, $a_2$, and $a_3$ used in quantization of the initial message can also be optimized.

The function $\rho(x)$ can be expressed by a polynomial including two terms whose degrees are equal to adjacent integer numbers m and m+1, as shown in equation (24). When the function $\rho(x)$ is expressed in such a manner, the mean value $\rho$(ave) of the numbers of 1s in the horizontal direction (in rows) of the parity check matrix, the quantization step sizes $a_1$, $a_2$, and $a_3$ and the function $\lambda(x)$ can be optimized for a given variance $\sigma$ of noise or for a given error probability after decoding.

Furthermore, it can be concluded that the best way of expressing the functions $\lambda(x)$ and $\rho(x)$ is to employ polynomials including two terms as shown in equations (23) and (24).

On the basis of the conclusion of the above discussion, the coding apparatus 1 of the transmitter in the data transmitting/receiving system can be constructed as described below.

Figure 12:
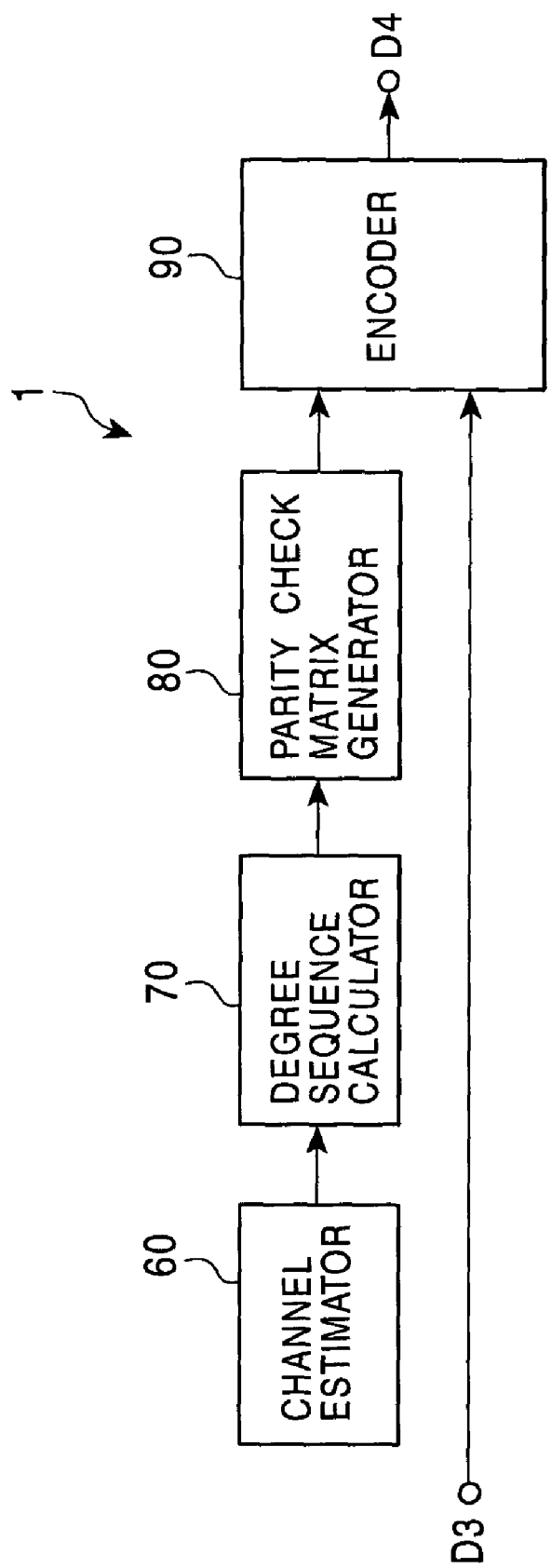
FIG. 12 is a block diagram showing a construction of a coding apparatus in the data transmitting/receiving system.

For example, as shown in FIG. 12 the coding apparatus 1 includes a channel estimator 60 for estimating the state of a communication channel, a degree sequence calculator 70 for calculating an optimum degree sequence on the basis of the variance $\sigma$, a parity check matrix generator 80 for producing a parity check matrix on the basis of the degree sequence calculated by the degree sequence calculator 70, and an encoder 90 for performing LDPC-coding using the parity check matrix produced by the parity check matrix generator 80.

The channel estimator 60 estimates the state of the communication channel and determines the variance $\sigma$ of noise. The channel estimator 60 supplies information indicating the determined variance $\sigma$ of noise to the degree sequence calculator 70.

The degree sequence calculator 70 calculates an optimum degree sequence on the basis of the variance $\sigma$ of noise determined by the channel estimator 60. More specifically, the degree sequence calculator 70 determines the degree sequence such that the error probability after decoding becomes smallest for the variance $\sigma$ of noise determined by the channel estimator 60. Alternatively, the degree sequence calculator 70 may determine the degree sequence such that the allowable variance $\sigma$ of noise becomes maximum for a given error probability after decoding. More specifically, the degree sequence calculator 70 fixes the degree m of the function $\rho(x)$ and determines a function $\lambda(x)$ so as to be optimized for a given variance $\sigma$ of noise or for a given error probability after decoding. The degree sequence calculator 70 then calculates the function $\rho(x)$ expressed by a polynomial including two terms whose degrees are set to adjacent integer numbers. Furthermore, the degree sequence calculator 70 calculates the function $\lambda(x)$ optimized for a given variance $\sigma$ of noise or for a given error probability after decoding and further calculates the mean value ρ(ave) of the numbers of 1s in the horizontal direction (in rows) of the parity check matrix. More desirably, the degree sequence calculator 70 calculates the optimized functions λ(x) and ρ(x) each expressed by a polynomial including two terms as shown in equations (23) and (24). The degree sequence calculator 70 supplies information indicating the calculated degree sequence to the parity check matrix generator 80.

The parity check matrix generator 80 produces a parity check matrix on the basis of the degree sequence calculated by the degree sequence calculator 70. The parity check matrix generator 80 supplies the produced parity check matrix to the encoder 90.

The encoder 90 performs LDPC decoding using the parity check matrix produced by the parity check matrix generator 80. More specifically, the encoder 90 produces a generator matrix on the basis of the parity check matrix and produces encoded data D4 by multiplying input data D3 input as information bits by the generator matrix. The encoder 90 outputs the resultant coded data D4 to a modulator (not shown).

The coding apparatus 1 constructed in the above-described manner encodes input data D3 using the parity check matrix based on the degree sequence optimized for the given variance σ of noise. The coded data D4 produced by the coding apparatus 1 is modulated by a modulator (not shown) by mapping each code bit of 0 into +1 and each code bit of 1 into −1. The modulated data is then transmitted to the receiver via the communication channel 2.

As for the decoding apparatus 3, the decoding apparatus described earlier with reference to FIG. 4 may be employed. In the data transmitting/receiving system, the coding apparatus 1 can determine the quantization step sizes $a_1$, $a_2$, and $a_3$ optimized for the given variance σ of noise and may transmit information indicating the determined quantization step sizes $a_1$, $a_2$, and $a_3$ to the decoding apparatus 3. In this case, the decoding apparatus 3 does not need the variance measuring unit 20 and the quantization step determiner 30 shown in FIG. 4, and thus the circuit of the decoding apparatus 3 can be constructed in a simplified fashion.

As described above, the coding apparatus 1 in the data transmitting/receiving system according to the present embodiment of the invention can calculate the degree sequence optimized such that when a received value or messages passed among nodes are represented by a small number of bits in the decoding apparatus 3, the error probability after decoding is minimized for a given variance σ of noise or the allowable variance σ of noise is maximized for a given error probability after decoding, whereby the error correction performance can be improved.

The decoding apparatus 3 can optimize the quantization step sizes used in representing the received value or messages passed among nodes such that the error probability after decoding is minimized for a given variance σ of noise or the allowable variance σ of noise is maximized for a given error probability after decoding, thereby achieving high accuracy in decoding of LDPC codes.

In this data transmitting/receiving system, as described above, a great improvement in code performance is achieved, and thus good convenience and high reliability can be provided to users.

Note that the present invention is not limited to the embodiments described above. For example, although in the embodiments described above, the coding apparatus and the decoding apparatus are respectively applied to the transmitter and the receiver in the data transmitting/receiving system, the present invention may also be applied to a recording and/or playback apparatus for recording and/or playing back data onto or from a recording medium such as a magnetic disk, an optical disk, or a magentooptical disk, wherein specific examples of the recording medium includes a floppy (trademark) disk, a CD-ROM disk, and a MO disk. In this case, data coded by a coding apparatus is recorded on a recording medium which corresponds to a communication channel, and the coded data recorded on the recording medium is decoded and played back by a decoding apparatus.

In the embodiments described above, both the coding apparatus and the decoding apparatus are constructed by means of hardware. Alternatively, the coding apparatus and the decoding apparatus may be realized by means of software executable on a computer such as a workstation or a personal computer. The realization of the coding apparatus and the decoding apparatus by means of software is described in further detail below with reference to FIG. 13.

Figure 13:
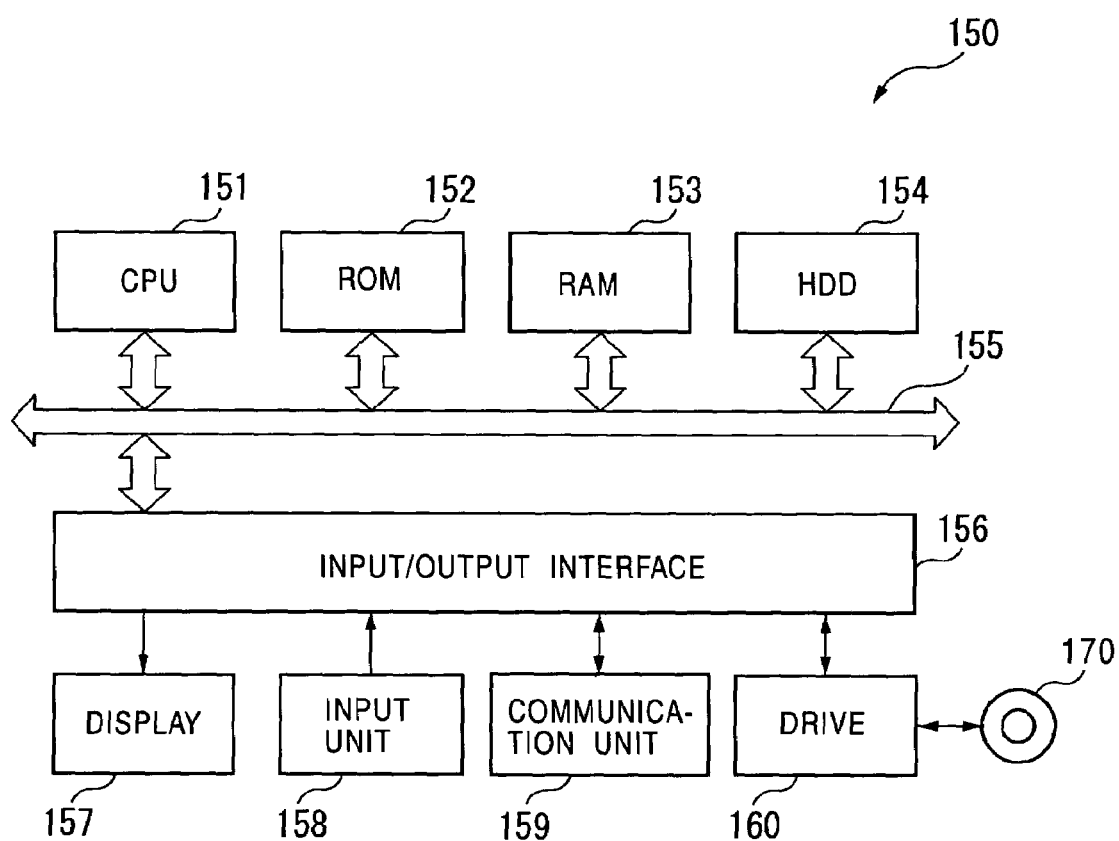
FIG. 13 is a block diagram showing a construction of a computer.
Figure 15:
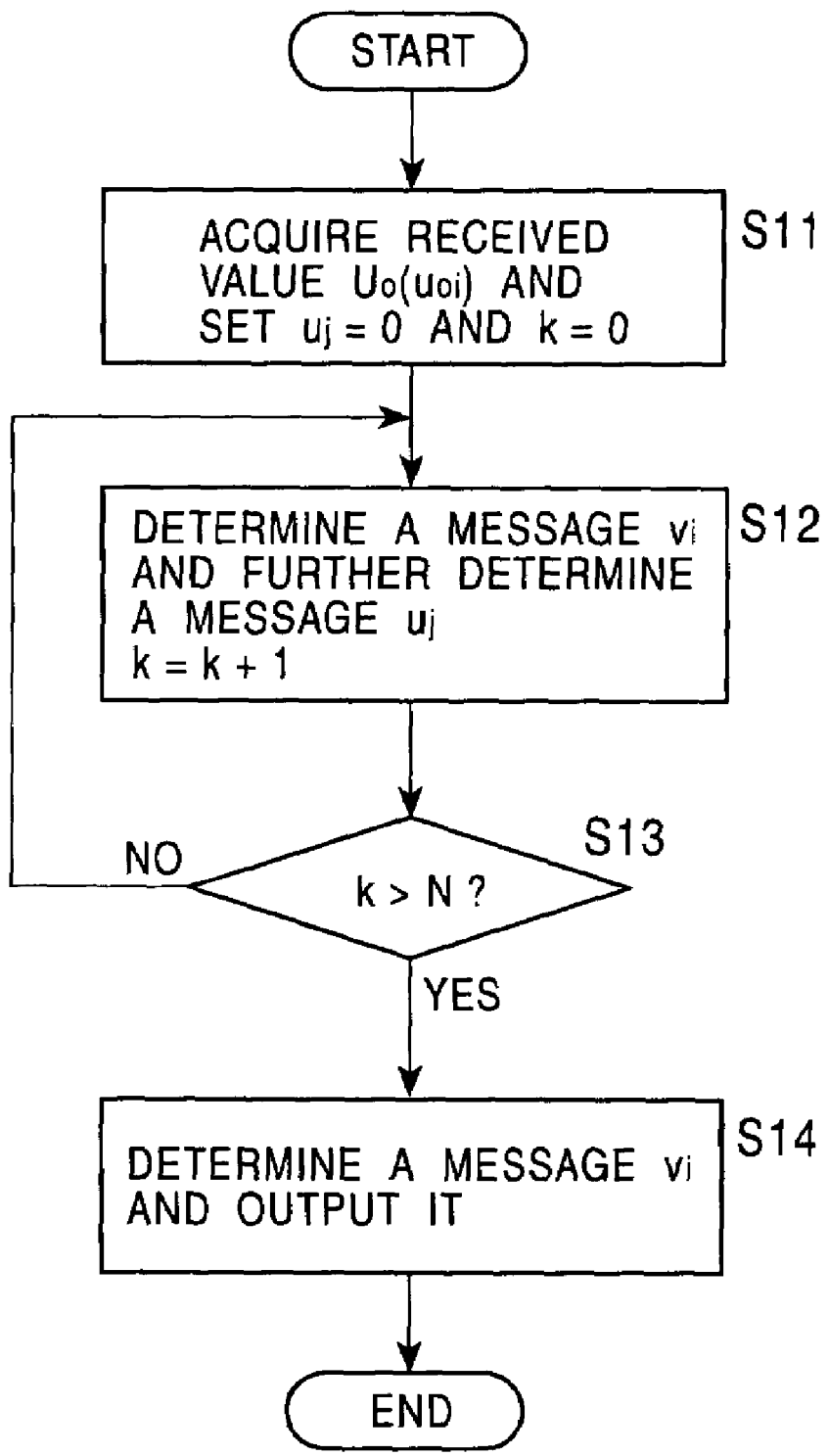
FIG. 15 is a flow chart showing a process of decoding a LDPC code.
Figure 16:
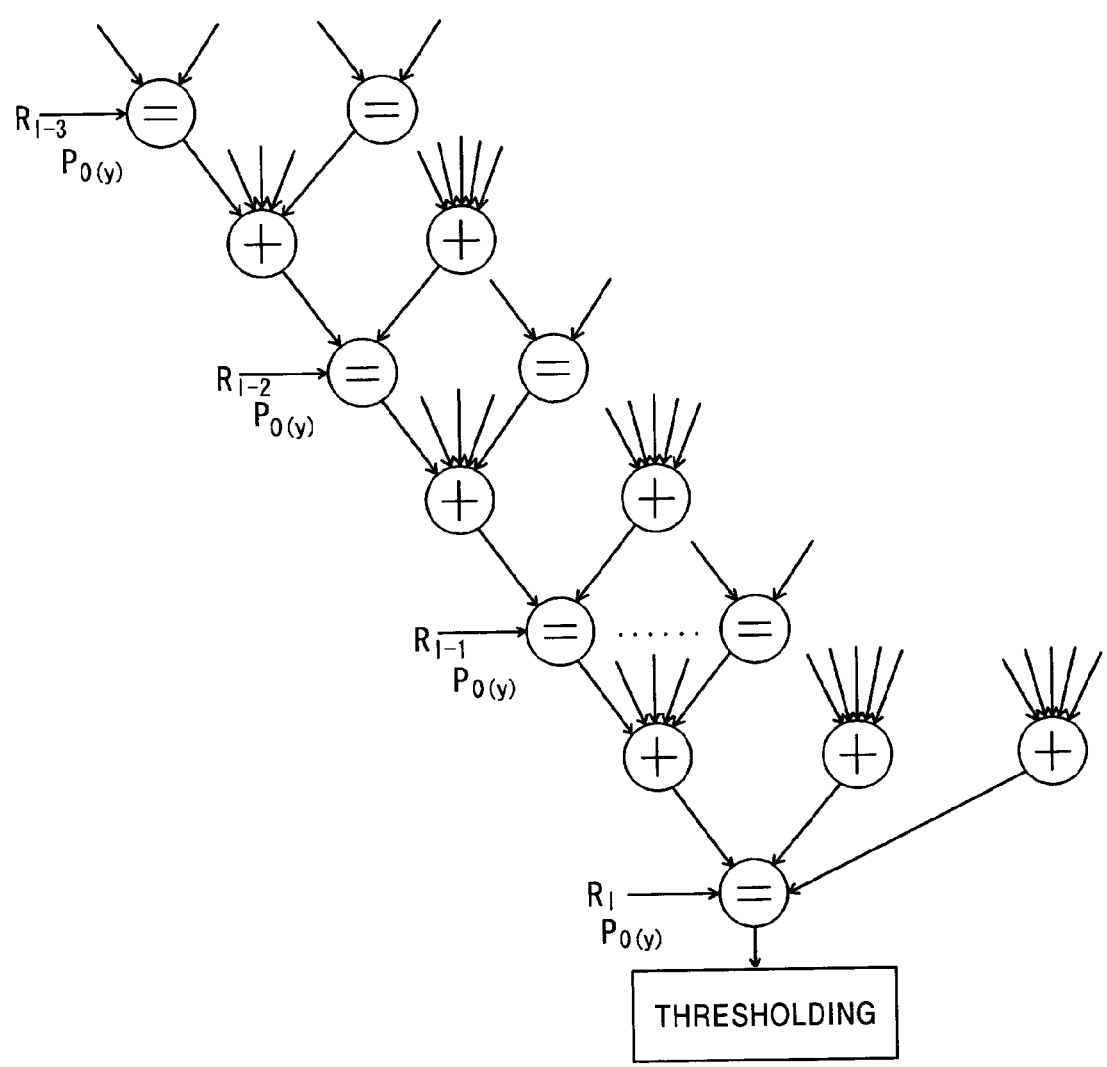
FIG. 16 a diagram showing a flow of messages among nodes in decoding of a (3, 6) code.
Figure 17:
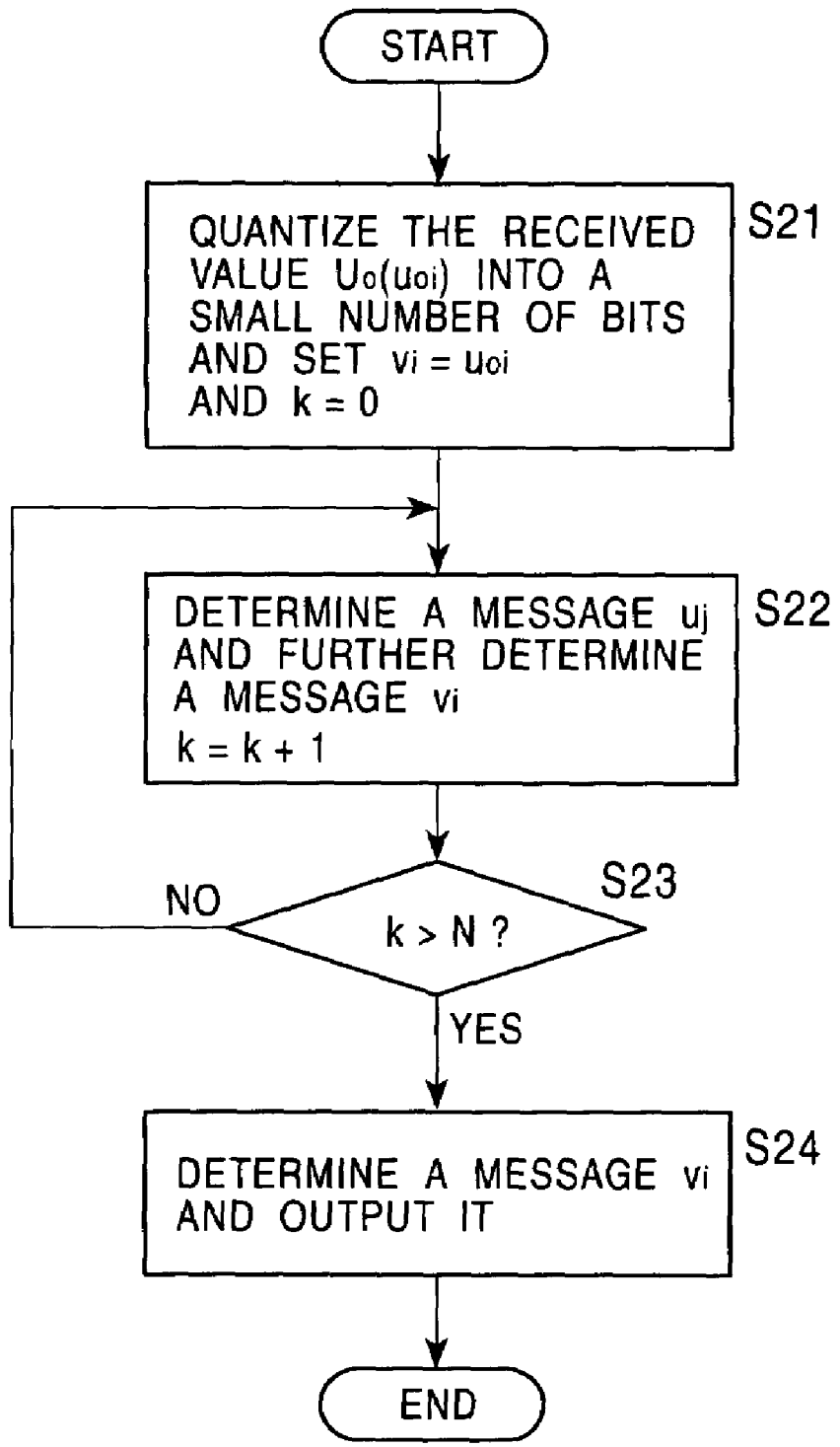
FIG. 17 is a flow chart showing a process of decoding a LDPC code by quantizing it into a value expressed by a small number of bits.

As shown in FIG. 13, a computer 150 includes a CPU (Central Processing Unit) 151 for generally controlling various parts of the computer 150, a ROM (Read Only Memory) 152 for storing information including various programs, a RAM (Random Access Memory) 153 used as a work area, a HDD (Hard Disk Drive) 154 for storing and/or reading various programs and data, a bus 155 for connecting the CPU 151, the ROM 152, the RAM 153, and the HDD 154 with one another, an input/output interface 156 for making it possible for the CPU 151, the ROM 152, the RAM 153, and the HDD 154 to input/output data from/to a display 157, an input unit 158, and communication unit 159, and a drive 160, which will be described later, the display 157 for displaying various kinds of information, the input unit 158 operated by a user, the communication unit 159 for communicating with the outside, and the drive 160 for storing and/or reading information to/from a removable storage medium 170.

The CPU 151 is connected to the ROM 152, the RAM 153, and the HDD 154 via the bus 155, whereby the CPU 151 controls the ROM 152, the RAM 153, and the HDD 154. The CPU 151 is also connected to the input/output interface 156 via the bus 155, whereby the CPU 151 controls the display 157, the input unit 158, the communication unit 159, and the drive 160, which are connected to the input/output interface 156. The CPU 151 executes various programs stored in the ROM 152, the HDD 154, or the storage medium 170 mounted on the drive 160.

The ROM 152 stores information including various programs. The information stored in the ROM 152 is read under the control of the CPU 151.

The RAM 153 serves as the work area used by the CPU 151 to execute various programs. The RAM 153 temporarily stores various data under the control of the CPU 151.

The HDD 154 stores and/or reads various programs or data to/from a hard disk under the control of the CPU 151.

The bus 155 transmits various data read from the ROM 152, the RAM 153, or the HDD 154 under the control of 151. The bus 155 also transmit various data to be stored in the RAM 153 or the HDD 154.

The input/output interface 156 includes an interface for displaying various kinds of information on the display 157 under the control of the CPU 151, an interface of transmitting, to the CPU 151, a control signal indicating a command or data input by a user via the input unit 158, an interface for inputting/outputting data from/to the outside via the communication unit 159 under the control of the CPU 151, and an interface for storing and/or reading various kinds of information onto/from the storage medium 170 mounted on the drive 160, thereby outputting data from the CPU 151, the ROM 152, the RAM 153 or the HDD 154 to the display 157, the input unit 158, the communication unit 159, or the drive 160, or inputting data from the display 157, the input unit 158, the communication unit 159, or the drive 160 to the CPU 151, the ROM 152, the RAM 153, or the HDD 154.

The Display 157 serves to display various kinds of information such as data stored on the HDD 154 under the control of the CPU 151. For example, a LCD (Liquid Crystal Display) can be used as the display 157.

The input unit 158 receives a command or data input by a user via a keyboard or a mouse, and the input unit 158 outputs a control signal indicating the input command or data to the CPU 151.

The communication unit 159 serves as an interface for communicating with the outside via a network or a satellite communication line under the control of the CPU 151.

On the drive 160, the storage medium 170 such as a magnetic disk, an optical disk, or a magentooptical disk is mounted, and the drive 160 stores and/or read various kinds of information onto/from the mounted storage medium 170 under the control of the CPU 151. Specific examples of the storage medium 170 includes a floppy (trademark) disk, a CD-ROM disk, and a MO disk.

On the computer 150, the coding process by the coding apparatus 1 and/or the decoding process by the decoding apparatus 3 can be implemented by executing a particular program using the CPU 151.

The coding process performed on the computer 150 is described below.

If a user performs a particular operation to execute a coding program on the computer 150, a control signal indicating the particular operation performed by the user is supplied from the input unit 158 to the CPU 151. In response, the computer 150 loads the coding program into the RAM 153 and executes it by the CPU 151. Data obtained via the coding and modulation process is output to the outside via the communication unit 159. If required, information indicating the result of processing or the like is displayed on the display 157.

In the above process, the coding program is provided from the storage medium 170. The coding program may be directly read from the storage medium 170 under the control of the CPU 151. Alternatively, the coding program may be installed onto the hard disk from the storage medium 170 and may be read from the hard disk when it is executed. The coding program may be stored in the ROM 152. Herein, it is assumed that data to be coded is stored on the hard disk. This data corresponds to the input data D3 described earlier.

More specifically, if the computer 150 starts executing the coding program on the CPU 151, the computer 150 first estimates the state of a communication channel and determines variance σ of noise under the control of the CPU 151.

Thereafter, the computer 150 calculates the optimum degree sequence on the basis of the determined variance σ of noise under the control of the CPU 151.

The computer 150 then produces a parity check matrix on the basis of the calculated degree sequence under the control of the CPU 151.

Thereafter, under the control of the CPU 151, the computer 150 reads data stored on the hard disk and performs LDPC-coding on the data by multiplying the data by the generator matrix based on the parity check matrix thereby producing coded data corresponding to the coded data D4 described above.

Furthermore, under the control of the CPU 151, the computer 150 maps the produced coded data into corresponding transmission symbols and temporarily stores the resultant transmission symbols on a hard disk or the like. Thereafter, under the control of the CPU 151, the computer 150 reads the transmission symbols at a desired time and outputs the transmission symbols to the outside via the communication unit 159. If required, information indicating the result of processing or the like is displayed on the display 157. The produced transmission symbols may be stored on the recording medium 170.

As described above, the coding process in the coding apparatus 1 can be implemented by executing the coding program on the computer 150.

The decoding process performed by the computer 150 is described below.

If a user performs a particular operation to execute a decoding program on the computer 150, a control signal indicating the particular operation performed by the user is supplied from the input unit 158 to the CPU 151. In response, the computer 150 loads the decoding program into the RAM 153 and executes it by the CPU 151. The computer 150 receives data from the outside via the communication unit 159 and decodes the received value. If required, information indicating the result of processing or the like is displayed on the display 157.

As with the coding program, the decoding program is provided, for example, from the storage medium 170. The decoding program may be directly read from the storage medium 170 under the control of the CPU 151. Alternatively, the decoding program may be installed on the hard disk from the storage medium 170 and may be read from the hard disk when it is executed. Alternatively, the decoding program may be stored in the ROM 152.

More specifically, if the computer 150 starts executing the decoding program on the CPU 151, the computer 150 measures variance σ of noise superimposed on the received value read from the hard disk or received from the outside via the communication unit 159, under the control of the CPU 151.

Thereafter, the computer 150 determines quantization step sizes optimized for the variance σ of noise and quantizes the probability distribution associated with the received value using the determined quantization step sizes.

Furthermore, under the control of the CPU 151, the computer 150 iteratively performs the decoding process on the quantized probability distribution associated with the received value a predetermined number of times, for example, several times to several ten times. The decoded data obtained as a result of the iterative decoding process is output. The decoded data obtained herein corresponds to the decoded data D2 described earlier. In the decoding process, the computer 150 quantizes, under the control of the CPU 151, the probability distributions associated with messages output from variable nodes by using quantization step sizes optimized for the measured variance σ of noise.

Thereafter, under the control of the CPU 151, the computer 150 stores the resultant decoded data on the hard disk or the like. If required, information indicating the result of processing or the like is displayed on the display 157. The decoded data may be stored on the recording medium 170.

As described above, the decoding process in the decoding apparatus 3 can be implemented by executing the decoding program on the computer 150.

It should be understood that various modifications are possible without departing from the scope and spirit of the present invention.

As described above in detail, the present invention provides a coding apparatus for coding input data using a low density parity check code, comprising degree sequence calculation means for calculating a degree sequence indicating the distribution of the number of 1s in the parity check matrix, parity check matrix generation means for generating a parity check matrix on the basis of the degree sequence calculated by the degree sequence calculation means, and coding means for coding the input data using the parity check matrix generated by the parity check matrix generation means, wherein the degree sequence calculation means optimizes the degree sequence such that when, in a decoding apparatus for decoding coded data, a received value and a message are represented by a small number of bits, the error probability after decoding is minimized for a given variance of noise or the allowable variance of noise is maximized for a given error probability after decoding.

In this coding apparatus according to the present invention, the degree sequence calculation means optimizes the degree sequence such that the error probability after decoding is minimized for a given variance of noise or the allowable variance of noise is maximized for a given error probability after decoding, thereby achieving a great improvement in performance of codes.

The present invention also provides a coding method for coding input data using a low density parity check code, comprising the steps of calculating a degree sequence indicating the distribution of the number of 1s in the parity check matrix, generating a parity check matrix on the basis of the degree sequence calculated in the degree sequence calculation step, and coding the input data using the parity check matrix generated in the parity check matrix generation step, wherein in the degree sequence calculation step, the degree sequence is optimized such that when, in a decoding process of decoding coded data, a received value and a message are represented by a small number of bits, the error probability after decoding is minimized for a given variance of noise or the allowable variance of noise is maximized for a given error probability after decoding.

In this coding method according to the present invention, the degree sequence is optimized such that the error probability after decoding is minimized for a given variance of noise or the allowable variance of noise is maximized for a given error probability after decoding, thereby achieving a great improvement in performance of codes.

The present invention also provides a decoding apparatus for decoding a code coded by a coding apparatus using a low density parity check code, the coding apparatus comprising degree sequence calculation means for calculating a degree sequence indicating the distribution of the number of is in the parity check matrix, parity check matrix generation means for generating a parity check matrix on the basis of the degree sequence calculated by the degree sequence calculation means, and coding means for coding the input data using the parity check matrix generated by the parity check matrix generation means, wherein the degree sequence calculation means optimizes the degree sequence such that the error probability after decoding is minimized for a given variance of noise or the allowable variance of noise is maximized for a given error probability after decoding, the decoding apparatus comprising receiving means for receiving data transmitted from the coding apparatus thereby acquiring a received value, quantization means for quantizing a probability distribution associated with the received value acquired by the receiving means into a value expressed in a predetermined small number of bits, and message calculation means for calculating a message as information bits on the basis of the probability distribution associated with the received value quantized by the quantization means.

In this decoding apparatus, the receiving means receives a code coded on the basis of the degree sequence optimized such that the error probability after decoding is minimized for a given variance of noise or the allowable variance of noise is maximized for a given error probability after decoding, the quantization means quantizes the probability distribution associated with the received value acquired by the receiving means into a value expressed in a predetermined small number of bits, and the message calculation means acquires the decoded data by performing decoding on the basis of the probability distribution associated with the received value quantized by the quantization means, thereby achieving high accuracy in decoding.

The present invention also provides a decoding method of decoding a code coded by a coding method using a low density parity check code, the coding method comprising the steps of calculating a degree sequence indicating the distribution of the number of 1s in the parity check matrix, generating a parity check matrix on the basis of the degree sequence calculated in the degree sequence calculation step, and coding the input data using the parity check matrix generated in the parity check matrix generation step, wherein in the degree sequence calculation step, the degree sequence is optimized such that the error probability after decoding is minimized for a given variance of noise or the allowable variance of noise is maximized for a given error probability after decoding, the decoding method comprising the steps of receiving transmitted data thereby acquiring a received value, quantizing a probability distribution associated with the received value acquired in the receiving step into a value expressed in a predetermined small number of bits, and calculating a message as information bits on the basis of the probability distribution associated with the received value quantized in the quantization processing step.

In this decoding method according to the present invention, a code, coded on the basis of the degree sequence optimized such that the error probability after decoding is minimized for a given variance of noise or the allowable variance of noise is maximized for a given error probability after decoding, is received, the probability distribution associated with the received value is quantized into a value expressed in a predetermined small number of bits, and decoding is performed on the basis of the quantized probability distribution associated with the received value, thereby achieving high accuracy in decoding.

What is claimed is:

1. A coding apparatus for coding input data using a low density parity check code, comprising degree sequence calculation means for calculating a degree sequence indicating the distribution of the number of 1s in the parity check matrix;

parity check matrix generation means for generating a parity check matrix on the basis of the degree sequence calculated by the degree sequence calculation means; and coding means for coding the input data using the parity check matrix generated by the parity check matrix generation means, wherein the degree sequence calculation means optimizes the degree sequence such that when, in a decoding apparatus for decoding coded data, a received value and a message are represented by a small number of bits, the error probability after decoding is minimized for a given variance of noise or the allowable variance of noise is maximized for a given error probability after decoding.

2. A coding apparatus according to claim 1, wherein the degree sequence calculation means expresses a horizontal degree sequence indicating the distribution of the number of 1s in the horizontal direction in the parity check matrix by a general formula (1) using a degree $m_i$ which is a parameter indicating the number of 1s and a weight $\rho_i$ which is a parameter indicating the weight associated with the degree $m_i$, and the degree sequence calculation means optimizes a vertical degree sequence indicating the distribution of the number of 1s in the vertical direction in the parity check matrix for a given variance of noise or for a given error probability after decoding, while fixing the degree $m_i$ $$\rho(x)=\Sigma\rho_i x^{m_i} \qquad (1).$$

3. A coding apparatus according to claim 1, wherein the degree sequence calculation means expresses a horizontal degree sequence indicating the distribution of the number of 1s in the horizontal direction in the parity check matrix by a general formula (2) in the form of the sum of two terms including degrees m and m+1 which are parameters taking adjacent integer numbers indicating the numbers of 1s and also including parameters $\rho(m)$ and $\rho(m+1)$ indicating the weights associated with the degrees m and m+1, and the degree sequence calculation means optimizes a vertical degree sequence indicating the distribution of the number of 1s in the vertical direction in the parity check matrix for a given variance of noise or for a given error probability after decoding, while fixing the degree $m_i$ $$\rho(x)=\rho(m)x^m+\rho(m+1)x^{m+1}$$

where $\rho(m)+\rho(m+1)=1$ \qquad (2).

4. A coding apparatus according to claim 3, wherein the degree sequence calculation means optimizes the mean value of the numbers of 1s in horizontal direction in the parity check matrix, for a given variance of noise or for a given error probability after decoding.

5. A coding apparatus according to claim 3, wherein the degree sequence calculation means expresses the vertical degree sequence indicating the distribution of the number of 1s in the vertical direction in the parity check matrix by a general formula (3) in the form of the sum of two terms including two degrees $n_1$ and $n_2$ which are parameters taking odd numbers indicating the numbers of 1s, and also including parameters $\lambda(n_1)$ and $\lambda(n_2)$ indicating the weights associated with the degrees $n_1$ and $n_2$ $$\lambda(x)=\lambda(n_1)x^{n_1}\lambda(n_2)x^{n_2}$$

where $\lambda(n_1)+\lambda(n_2)=3$ \qquad (3).

6. A coding apparatus according to claim 5, wherein the degree sequence calculation means set the degree $n_1$ to 3.

7. A coding apparatus according to claim 1, further comprising channel estimation means for estimating the state of the communication channel and determining the variance of noise.

8. A coding apparatus according to claim 1, further comprising transmission means for determining a quantization step size, which is to be used by the decoding apparatus to quantize the received value, such that the quantization step size is optimized so as to minimize the error probability after decoding for a given variance of noise or so as to maximize the allowable variance of noise for a given error probability after decoding, and transmitting information indicating the determined quantization step size.

9. A coding apparatus according to claim 1, wherein the coding means produces a generator matrix on the basis of the parity check matrix generated by the parity check matrix generation means and multiplies input data by the generator matrix.

10. A coding apparatus according to claim 1, wherein the coding means performs coding at a coding rate of ½.

11. A coding method for coding input data using a low density parity check code, comprising the steps of
calculating a degree sequence indicating the distribution of the number of 1s in the parity check matrix;
generating a parity check matrix on the basis of the degree sequence calculated in the degree sequence calculation step; and
coding the input data using the parity check matrix generated by the parity check matrix generation step,
wherein in the degree sequence calculation step, the degree sequence is optimized such that when, in a decoding process of decoding coded data, a received value and a message are represented by a small number of bits, the error probability after decoding is minimized for a given variance of noise or the allowable variance of noise is maximized for a given error probability after decoding.

12. A coding method according to claim 11, wherein in the degree sequence calculation step, a horizontal degree sequence indicating the distribution of the number of 1s in the horizontal direction in the parity check matrix is expressed by a general formula (1) using a degree $m_i$ which is a parameter indicating the number of 1s and a weight $\rho_1$ which is a parameter indicating the weight associated with the degree $m_i$, and a vertical degree sequence indicating the distribution of the number of 1s in the vertical direction in the parity check matrix is optimized for a given variance of noise or for a given error probability after decoding, while fixing the degree $m_i$ $$\rho(x)=\Sigma\rho_i x^{m_i} \qquad (1).$$

13. A coding method according to claim 11, wherein in the degree sequence calculation step, a horizontal degree sequence indicating the distribution of the number of 1s in the horizontal direction in the parity check matrix is expressed by a general formula (2) in the form of the sum of two terms including degrees m and m+1 which are parameters taking adjacent integer numbers indicating the numbers of is and also including parameters $\rho(m)$ and $\rho(m+1)$ indicating the weights associated with the degrees m and m+1, and a vertical degree sequence indicating the distribution of the number of 1s in the vertical direction in the parity check matrix is optimized for a given variance of noise or for a given error probability after decoding, while fixing the degree $m_i$ $$\rho(x)=\rho(m)x^m+\rho(m+1)x^{m+1}$$

where $\rho(m)+\rho(m+1)=1$ \qquad (2).

14. A coding method according to claim 13, wherein in the degree sequence calculation step, the mean value of the numbers of 1s in horizontal direction in the parity check matrix is optimized for given variance of noise or for a given error probability in decoded data.

15. A coding method according to claim 13, wherein in the degree sequence calculation step, the vertical degree sequence indicating the distribution of the number of 1s in the vertical direction in the parity check matrix is expressed by a general formula (3) in the form of the sum of two terms including degrees $n_1$ and $n_2$ which are parameters taking odd numbers indicating the numbers of 1s, and also including parameters $\lambda(n_1)$ and $\lambda(n_2)$ indicating the weights associated with the degrees $n_1$ and $n_2$ $$\lambda(x)=\lambda(n_i)x^{n_1}+\lambda(n_2)x^{n_2}$$

where $\lambda(n_1)+\lambda(n_2)=1$ \hfill (3).

16. A coding method according to claim 15, wherein in the degree sequence calculation step, the degree $n_1$ is set to 3.

17. A coding method according to claim 11, further comprising the step of estimating the state of the communication channel and determining the variance of noise.

18. A coding method according to claim 11, further comprising the step of determining a quantization step size, which is to be used in quantization of the received value in the decoding process, such that the quantization step size is optimized so as to minimize the error probability after decoding for a given variance of noise or so as to maximize the allowable variance of noise for a given error probability after decoding, and transmitting information indicating the determined quantization step size.

19. A coding method according to claim 11, wherein in the coding step, a generator matrix is produced on the basis of the parity check matrix generated in the parity check matrix generation step and the input data is multiplied by the generator matrix.

20. A coding method according to claim 11, wherein in the coding step, coding is performed at a coding rate of ½.

21. A decoding apparatus for decoding a code coded by a coding apparatus using a low density parity check code, the coding apparatus comprising degree sequence calculation means for calculating a degree sequence indicating the distribution of the number of 1s in the parity check matrix; parity check matrix generation means for generating a parity check matrix on the basis of the degree sequence calculated by the degree sequence calculation means, and coding means for coding the input data using the parity check matrix generated by the parity check matrix generation means, wherein the degree sequence calculation means optimizes the degree sequence such that the error probability after decoding is minimized for a given variance of noise or the allowable variance of noise is maximized for a given error probability after decoding, the decoding apparatus comprising receiving means for receiving data transmitted from the coding apparatus thereby acquiring a received value;

quantization means for quantizing a probability distribution associated with the received value acquired by the receiving means into a value expressed in a predetermined small number of bits; and message calculation means for calculating a message as information bits on the basis of the probability distribution associated with the received value quantized by the quantization means.

22. A decoding apparatus according to claim 21, wherein the message calculation means quantizes a probability distribution associated with a message output from a variable node into a value expressed in a predetermined small number of bits.

23. A decoding apparatus according to claim 21, further comprising variance measurement means for measuring the variance of noise superimposed on the data received by the receiving means; and quantization step size determination means for determining an optimum quantization step size on the basis of the variance determined by the variance measurement means, wherein the quantization means quantizes the probability distribution associated with the received value using the quantization step size determined by the quantization step size determination means.

24. A decoding apparatus according to claim 23, wherein when the message calculation means quantizes the probability distribution associated with the message output from the variable node into the value expressed in the predetermined small number of bits, the message calculation means quantizes the probability distribution associated with the message using the quantization step size determined by the quantization step size determination means.

25. A decoding apparatus according to claim 21, wherein the receiving means receives, from the coding apparatus, the information indicating the value of the quantization step size to be used in the quantization performed by the quantization means; and the quantization means quantizes the probability distribution associated with the received value on the basis of the information indicating the value of the quantization step size received by the receiving means.

26. A decoding apparatus according to claim 21, wherein the message calculation means calculates a probability distribution associated with a message output from a variable node on the basis of the probability distribution associated with the received value quantized by the quantization means, and furthermore, on the basis of this probability distribution, the message calculation means iteratively performs a decoding process of calculating a probability distribution associated with a message output from a check node a predetermined number of times.

27. A decoding method of decoding a code coded by a coding method using a low density parity check code, the coding method comprising the steps of calculating a degree sequence indicating the distribution of the number of 1s in the parity check matrix; generating a parity check matrix on the basis of the degree sequence calculated in the degree sequence calculation step, and coding the input data using the parity check matrix generated in the parity check matrix generation step, wherein in the degree sequence calculation step, the degree sequence is optimized such that the error probability after decoding is minimized for a given variance of noise or the allowable variance of noise is maximized for a given error probability after decoding, the decoding method comprising the steps of receiving transmitted data thereby acquiring a received value;

quantizing a probability distribution associated with the received value acquired in the receiving step into a value expressed in a predetermined small number of bits; and calculating a message as information bits on the basis of the probability distribution associated with the received value quantized in the quantization processing step.

28. A decoding method according to claim 27, wherein in the message calculation step, a probability distribution associated with a message output from a variable node is quantized into a value expressed in a predetermined small number of bits.

29. A decoding method according to claim 27, further comprising the steps of measuring the variance of noise superimposed on the data received in the receiving step; and determining an optimum quantization step size on the basis of the variance determined in the variance measurement step, wherein in the quantization processing step, the probability distribution associated with the received value is quantized using the quantization step size determined in the quantization step size determination step.

30. A decoding method according to claim 29, wherein in the message calculation step, when the probability distribution associated with the message output from the variable node is quantized into the value expressed in the predetermined small number of bits, the probability distribution associated with the message is quantized using the quantization step size determined in the quantization step size determination step.

31. A decoding method according to claim 27, wherein
in the receiving step, information indicating the value of the quantization step size to be used in quantization in the quantization processing step is received; and
in the quantization processing step, the probability distribution associated with the received value is quantized on the basis of the information indicating the value of the quantization step size received in the receiving step.

32. A decoding method according to claim 27, wherein in the message calculation step, a probability distribution associated with a message output from a variable node is calculated on the basis of the probability distribution associated with the received value quantized in the quantization processing step, and furthermore, on the basis of this probability distribution, a decoding process of calculating a probability distribution associated with a message output from a check node is iteratively performed a predetermined number of times.

* * * * *